United States Patent
Wu

(10) Patent No.: US 11,894,304 B2
(45) Date of Patent: Feb. 6, 2024

(54) SEMICONDUCTOR DEVICE WITH AIR GAP BELOW LANDING PAD AND METHOD FOR FORMING THE SAME

(71) Applicant: NANYA TECHNOLOGY CORPORATION, New Taipei (TW)

(72) Inventor: Chih-Tsung Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 274 days.

(21) Appl. No.: 17/374,343

(22) Filed: Jul. 13, 2021

(65) Prior Publication Data

US 2023/0014071 A1    Jan. 19, 2023

(51) Int. Cl.

| | |
|---|---|
| *H01L 23/532* | (2006.01) |
| *H01L 21/768* | (2006.01) |
| *H01L 21/764* | (2006.01) |
| *H01L 23/528* | (2006.01) |
| *H01L 23/522* | (2006.01) |
| H10B 12/00 | (2023.01) |

(52) U.S. Cl.
CPC ........ *H01L 23/5329* (2013.01); *H01L 21/764* (2013.01); *H01L 21/7682* (2013.01); *H01L 21/76843* (2013.01); *H01L 23/5226* (2013.01); *H01L 23/5283* (2013.01); *H01L 23/53261* (2013.01); *H10B 12/0335* (2023.02); *H10B 12/482* (2023.02)

(58) Field of Classification Search
CPC .............. H01L 23/5329; H01L 21/764; H01L 21/7682; H01L 21/76843; H01L 23/5226; H01L 23/5283; H01L 23/53261; H01L 21/76852; H01L 21/76889; H01L 23/5386; H01L 21/76897; H01L 29/0649; H10B 12/0335; H10B 12/482

See application file for complete search history.

(56) References Cited

U.S. PATENT DOCUMENTS

2002/0173139 A1* 11/2002 Kweon ................... H10B 53/00
                                                                257/E21.664
2009/0273084 A1* 11/2009 Ayotte ..................... H01L 23/57
                                                                257/E23.141

(Continued)

FOREIGN PATENT DOCUMENTS

TW            202044357 A         12/2020

*Primary Examiner* — Patricia D Valenzuela
(74) *Attorney, Agent, or Firm* — MUNCY, GEISSLER, OLDS & LOWE, P.C.

(57) ABSTRACT

The present disclosure relates to a semiconductor device with an air gap below a landing pad and a method for forming the semiconductor device. The semiconductor device includes a first lower plug and a second lower plug disposed over a semiconductor substrate. The semiconductor device also includes a first landing pad disposed over a top surface and upper sidewalls of the first lower plug, and a first upper plug disposed over the first landing pad and electrically connected to the first lower plug. A width of the first lower plug is greater than a width of the first upper plug. The semiconductor device further includes a dielectric layer disposed over the semiconductor substrate. The first lower plug, the second lower plug, the first landing pad and the first upper plug are disposed in the dielectric layer, and the dielectric layer includes an air gap disposed between the first lower plug and the second lower plug.

8 Claims, 28 Drawing Sheets

(56) References Cited

U.S. PATENT DOCUMENTS

2015/0056801 A1* 2/2015 Park .................... H01L 21/7682
                                                            438/655
2015/0132945 A1    5/2015 Park
2019/0103302 A1* 4/2019 Yoon .................... H10B 12/482

* cited by examiner

SEMICONDUCTOR DEVICE WITH AIR GAP BELOW LANDING PAD AND METHOD FOR FORMING THE SAME

TECHNICAL FIELD

The present disclosure relates to a semiconductor device and a method for forming the same, and more particularly, to a semiconductor device with an air gap below a landing pad and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as poor electrical interconnection due to misalignment between upper conductive features and lower conductive features. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first lower plug and a second lower plug disposed over a semiconductor substrate. The semiconductor device also includes a first landing pad disposed over a top surface and upper sidewalls of the first lower plug, and a first upper plug disposed over the first landing pad and electrically connected to the first lower plug. A width of the first lower plug is greater than a width of the first upper plug. The semiconductor device further includes a dielectric layer disposed over the semiconductor substrate. The first lower plug, the second lower plug, the first landing pad and the first upper plug are disposed in the dielectric layer, and the dielectric layer includes an air gap disposed between the first lower plug and the second lower plug.

In an embodiment, the semiconductor device further includes a second landing pad disposed over a top surface and upper sidewalls of the second lower plug, and a second upper plug disposed over the second landing pad and electrically connected to the second lower plug, wherein a distance between the first upper plug and the second upper plug is greater than a distance between the first lower plug and the second lower plug. In an embodiment, a bottom width of the first lower plug is greater than a top width of the first lower plug, and the top width of the first lower plug is greater than the width of the first upper plug. In an embodiment, a top surface of the first lower plug is higher than a topmost surface of the air gap. In an embodiment, the first landing pad is made of copper germanide ($Cu_3Ge$).

In an embodiment, the semiconductor device further includes a first barrier layer covering a bottom surface, lower sidewalls and the upper sidewalls of the first lower plug, wherein a portion of the first barrier layer is sandwiched between the first landing pad and the first lower plug. In an embodiment, the first landing pad includes an inner portion covering the top surface of the first lower plug, and a plurality of outer portions covering top surfaces and upper sidewalls of the first barrier layer, wherein the inner portion and the outer portions are made of different materials. In an embodiment, top surfaces of the outer portions of the first landing pad are higher than a top surface of the inner portion of the first landing pad. In an embodiment, the inner portion of the first landing pad is made of tungsten silicide (WSi), and the outer portions of the first landing pad are made of titanium silicide (TiSi).

In another embodiment of the present disclosure, a method for forming a semiconductor device is provided. The method includes forming a first lower plug and a second lower plug over a semiconductor substrate, and forming a first dielectric layer surrounding the first lower plug and the second lower plug. A top surface and upper sidewalls of the first lower plug and a top surface and upper sidewalls of the second lower plug are protruded from the first dielectric layer. The method also includes performing a heat treatment process to form a first landing pad over the top surface and the upper sidewalls of the first lower plug and a second landing pad over the top surface and the upper sidewalls of the second lower plug, and removing the first dielectric layer after the heat treatment process is performed such that an opening is formed between the first lower plug and the second lower plug. The method further includes depositing a second dielectric layer in the opening and over the first landing pad and the second landing pad such that an air gap is formed in the opening and enclosed by the second dielectric layer, and forming a first upper plug in the second dielectric layer and over the first landing pad. A width of the first lower plug is greater than a width of the first upper plug.

In an embodiment, the method further includes forming a second upper plug in the second dielectric layer and over the second landing pad, wherein a distance between the first upper plug and the second upper plug is greater than a distance between the first lower plug and the second lower plug. In an embodiment, a silicon-containing gas is used during the heat treatment process. In an embodiment, the method further includes forming a sacrificial dielectric layer with a first opening and a second opening over a semiconductor substrate, and forming a first barrier layer and a second barrier layer lining the first opening and the second opening, respectively. In addition, the method includes forming the first lower plug and the second lower plug over the first barrier layer and the second barrier layer, respectively, and removing the sacrificial dielectric layer after the first lower plug and the second lower plug are formed.

In an embodiment, the first opening and the second opening have tapered profiles tapering away from the semiconductor substrate. In an embodiment, the first landing pad includes a first inner portion covering the top surface of the first lower plug, and a plurality of outer portions covering top surfaces and upper sidewalls of the first barrier layer, wherein top surfaces of the outer portions are higher than a top surface of the inner portion, and wherein the inner portion and the outer portions are formed simultaneously by the heat treatment process.

Embodiments of a semiconductor device and method for forming the same are provided in the disclosure. In some embodiments, the semiconductor device includes a plurality of lower plugs disposed over a semiconductor substrate (or a plurality of gate structures over gate stacks when the semiconductor device is a gate-all-around (GAA) transistor), a landing pad disposed over a top surface and upper sidewalls of one of the lower plugs, and an upper plug disposed over the landing pad. The landing pad provides an increased landing area for the upper plug to land on. Therefore, the misalignment issues between the upper plug and the lower plug may be prevented or reduced. Moreover, an air gap is formed below the landing pad and between the lower plugs (or between the gate stacks when the semiconductor device is a GAA transistor). Therefore, the parasitic capacitance between the lower plugs (or the gate stacks) may be reduced. As a result, the yield rate of the semiconductor device may be increased, and the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
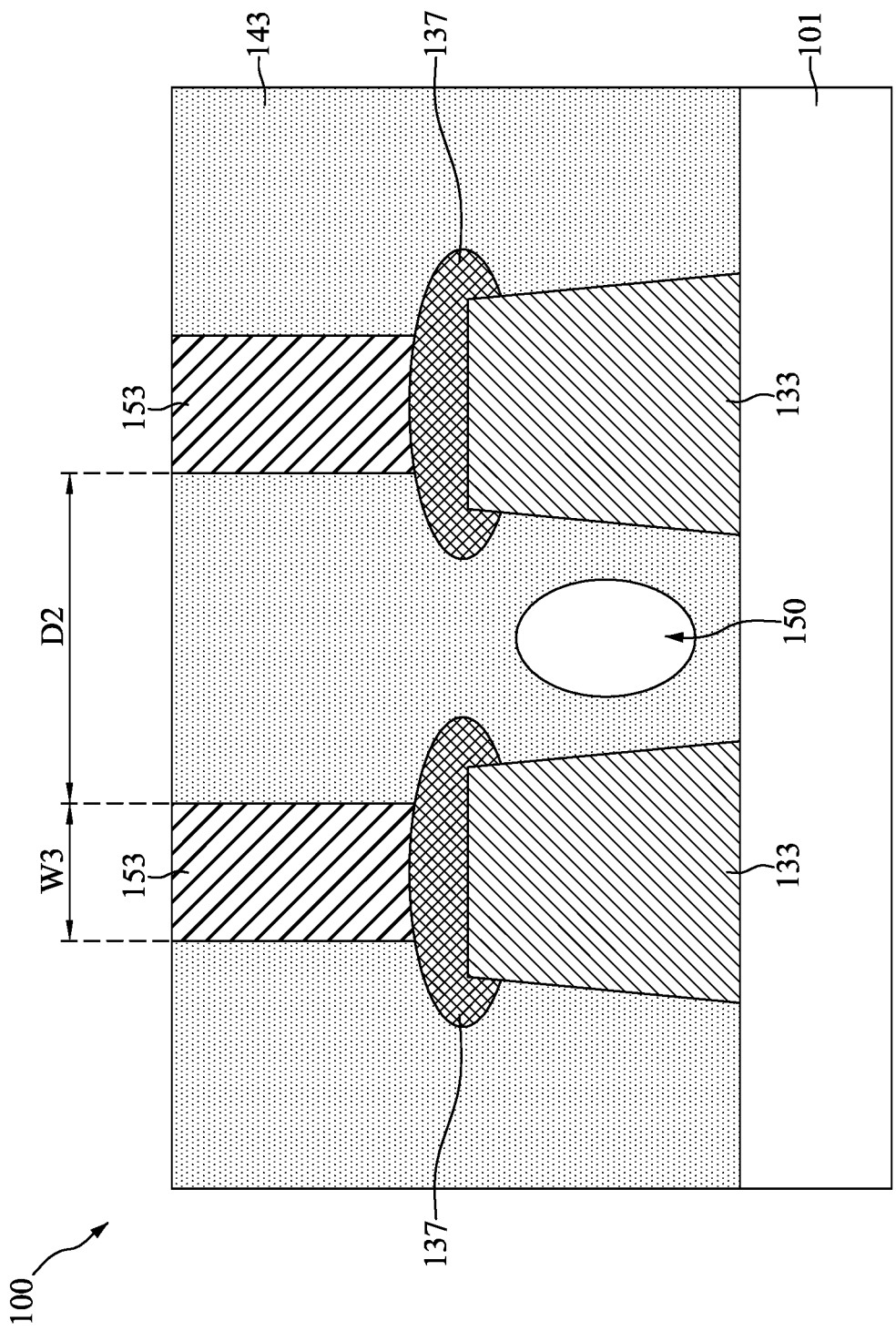
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. In some embodiments, the semiconductor device 100 includes a semiconductor substrate 101, a plurality of lower plugs 133 disposed over the semiconductor substrate 101, a plurality of landing pads 137 disposed over the lower plugs 133, and a plurality of upper plugs 153 disposed over the landing pads 137. In some embodiment, the upper plugs 153 are electrically connected to the lower plugs 133 through the landing pads 137. In addition, the semiconductor device 100 includes a dielectric layer 143 (also referred to as inter-metal dielectric (IMD) layer) disposed over the semiconductor substrate 101.

In some embodiments, the lower plugs 133, the landing pads 137 and the upper plugs 153 are disposed in the dielectric layer 143. In other words, the lower plugs 133, the landing pads 137 and the upper plugs 153 are surrounded by the dielectric layer 143. Moreover, the dielectric layer 143 includes an air gap 150 disposed between the adjacent lower plugs 133. In some embodiments, the air gap 150 is enclosed by the dielectric layer 143. In addition, it should be noted that in some embodiments, the landing pads 137 are disposed over the top surfaces and the upper sidewalls of the lower plugs 133. In some embodiments, the top surfaces and the upper sidewalls of the lower plugs 133 are covered by and in direct contact with the landing pads 137.

Figure 2:
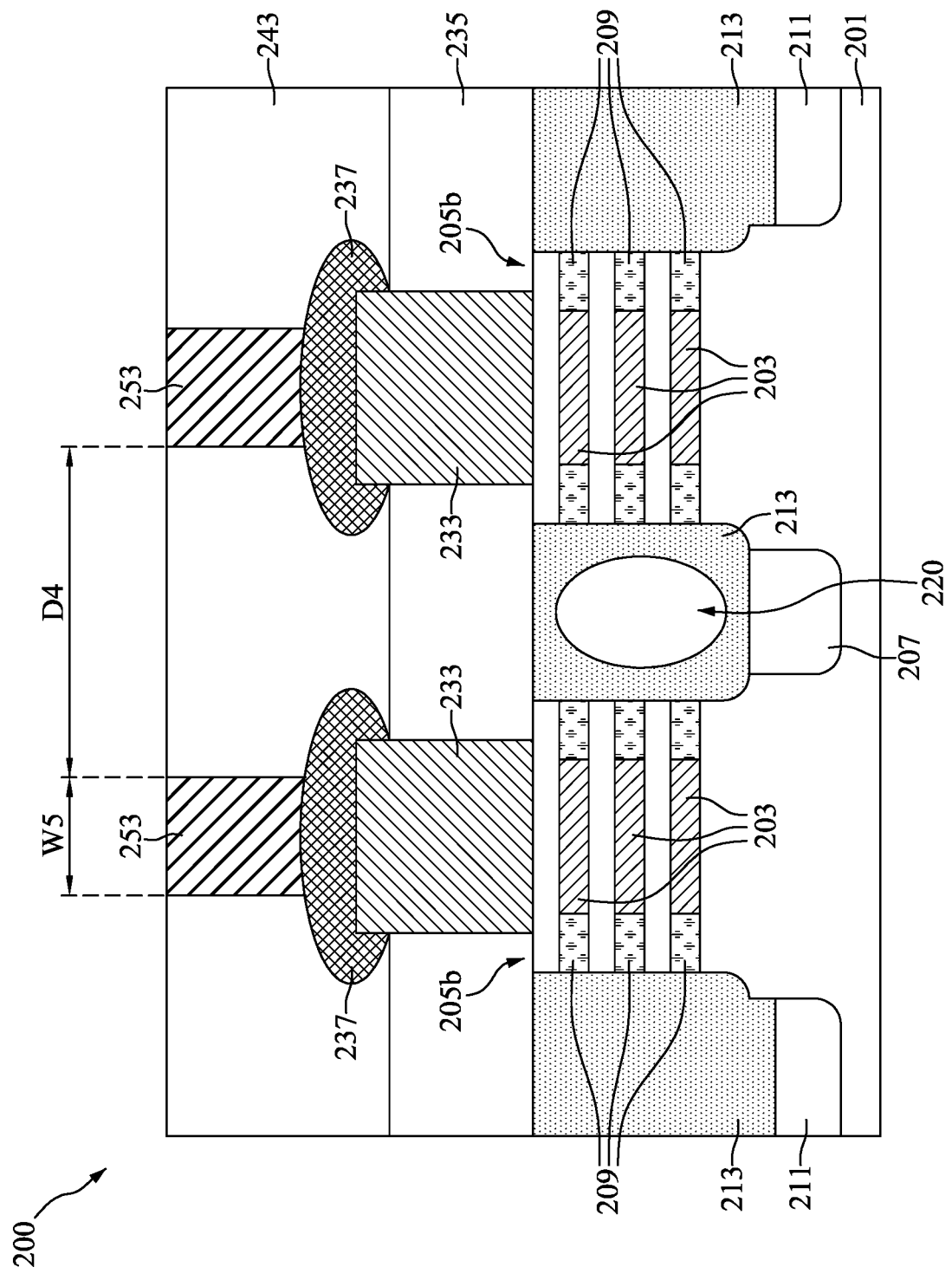
FIG. 2 is a cross-sectional view illustrating a semiconductor device, in accordance with some embodiments.

FIG. 2 is a cross-sectional view illustrating a semiconductor device 200, in accordance with some embodiments. In some embodiments, the semiconductor device 200 includes a semiconductor substrate 201 which has been patterned to form a plurality of gate stacks 205a and 205b. At least one of the gate stacks 205a and 205b has a plurality of alternating stacked semiconductor layers (semiconductor substrate 201) and gate layers 203.

In some embodiments, the semiconductor device 200 also includes an inner isolation structure 207 disposed between the gate stacks 205a and 205b, and a plurality of outer isolation structures 211 disposed on the sides of the gate stacks 205a and 205b that are opposite to the sides of the inner isolation structure 207. In some embodiments, the semiconductor device 200 further includes a semiconductor material 213 disposed over the inner isolation structure 207 and the outer isolation structures 211, and the portion of the semiconductor material 213 between the gate stacks 205a and 205b includes an air gap 220. In some embodiments, the air gap 220 is enclosed by the semiconductor material 213.

In some embodiments, the top surface of the semiconductor material 213 is substantially level with the top surface of the semiconductor substrate 201 (i.e., the top surface of the gate stacks 205a and 205b). Within the context of this disclosure, the word "substantially" means preferably at least 90%, more preferably 95%, even more preferably 98%, and most preferably 99%. Moreover, the semiconductor device 200 further includes a plurality of inner spacers 209 stacked between the semiconductor layers (semiconductor substrate 201) of the gate stacks 205a, 205b and adjoin opposite sides of the gate layers 203.

Still referring to FIG. 2, the semiconductor device 200 includes a plurality of gate structures 233 disposed over at least one of the gate stacks 205a and 205b, and a dielectric layer 235 (also referred to as IMD layer) disposed over the gate stacks 205a, 205b and the semiconductor material 213 and surrounding the gate structures 233, in accordance with some embodiments. It should be noted that the upper portions of the gate structures 233 are protruded from the dielectric layer 235. In some embodiments, the top surfaces and the upper sidewalls of the gate structures 233 are protruded from (i.e., not covered by) the dielectric layer 235.

In some embodiments, the semiconductor device 200 includes a plurality of landing pads 237 disposed over the gate structures 233, and a plurality of plugs 253 (also referred to as upper plugs) disposed over the landing pads 237. In some embodiment, the plugs 253 are electrically connected to the gate structures 233 through the landing pads 237. In addition, the semiconductor device 200 includes a dielectric layer 243 (also referred to as IMD layer) disposed over the dielectric layer 235. In some embodiments, the gate structures 233, the landing pads 237 and the plugs 253 are disposed in the dielectric layer 243. In other words, the gate structures 233, the landing pads 237 and the plugs 253 are surrounded by the dielectric layer 243.

Figure 3:
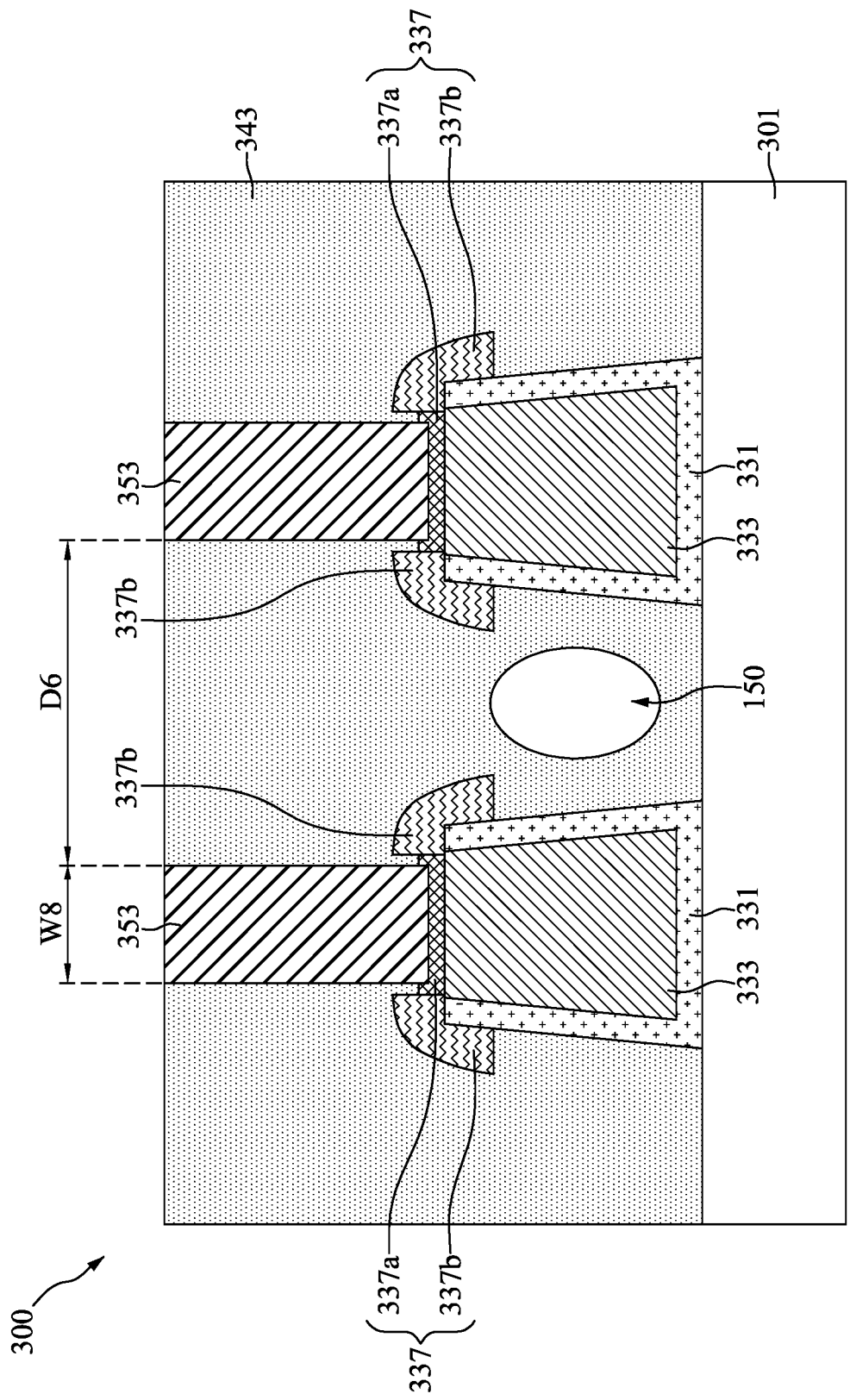
FIG. 3 is a cross-sectional view illustrating a semiconductor device, in accordance with some embodiments.

FIG. 3 is a cross-sectional view illustrating a semiconductor device 300, in accordance with some embodiments.

In some embodiments, the semiconductor device 300 includes a semiconductor substrate 301, a plurality of lower plugs 333 and a plurality of barrier layers 331 disposed over the semiconductor substrate 301, a plurality of landing pads 337 disposed over the lower plugs 333 and the barrier layers 331, and a plurality of upper plugs 353 disposed over the landing pads 337. In some embodiment, the upper plugs 353 are electrically connected to the lower plugs 333 through the landing pads 337. In addition, the semiconductor device 300 includes a dielectric layer 343 (also referred to as IMD layer) disposed over the semiconductor substrate 301.

In some embodiments, the lower plugs 333 are disposed over the barrier layers 331, and at least one of the barrier layers 331 extends to surround the corresponding lower plugs 333. In other words, the barrier layers 331 cover the bottom surfaces and the sidewalls of the lower plugs 333. In addition, at least one of the landing pads 337 includes outer portions 337b and an inner portion 337a disposed between the outer portions 337b. It should be noted that the inner portions 337a of the landing pads 337 are disposed over the lower plugs 333, and the outer portions 337b of the landing pads 337 are disposed over the barrier layers 331. In some embodiments, the inner portions 337a are in direct contact with the top surfaces of the lower plugs 333, and the outer portions 337b are in direct contact with the top surfaces and the upper sidewalls of the barrier layers 331.

In some embodiments, the lower plugs 333, the landing pads 337 and the upper plugs 353 are disposed in the dielectric layer 343. In other words, the lower plugs 333, the landing pads 337 and the upper plugs 353 are surrounded by the dielectric layer 343. Moreover, the dielectric layer 343 includes an air gap 350 disposed between the adjacent lower plugs 333 (i.e., between the adjacent barrier layers 331). In some embodiments, the air gap 350 is enclosed by the dielectric layer 343. In some embodiments, the upper plugs 353 are separated from the outer portions 337b of the landing pads 337 by a portion of the dielectric layer 343. However, in some other embodiments, the upper plugs 353 are in direct contact with the outer portions 337b of the landing pads 337.

Figure 4:
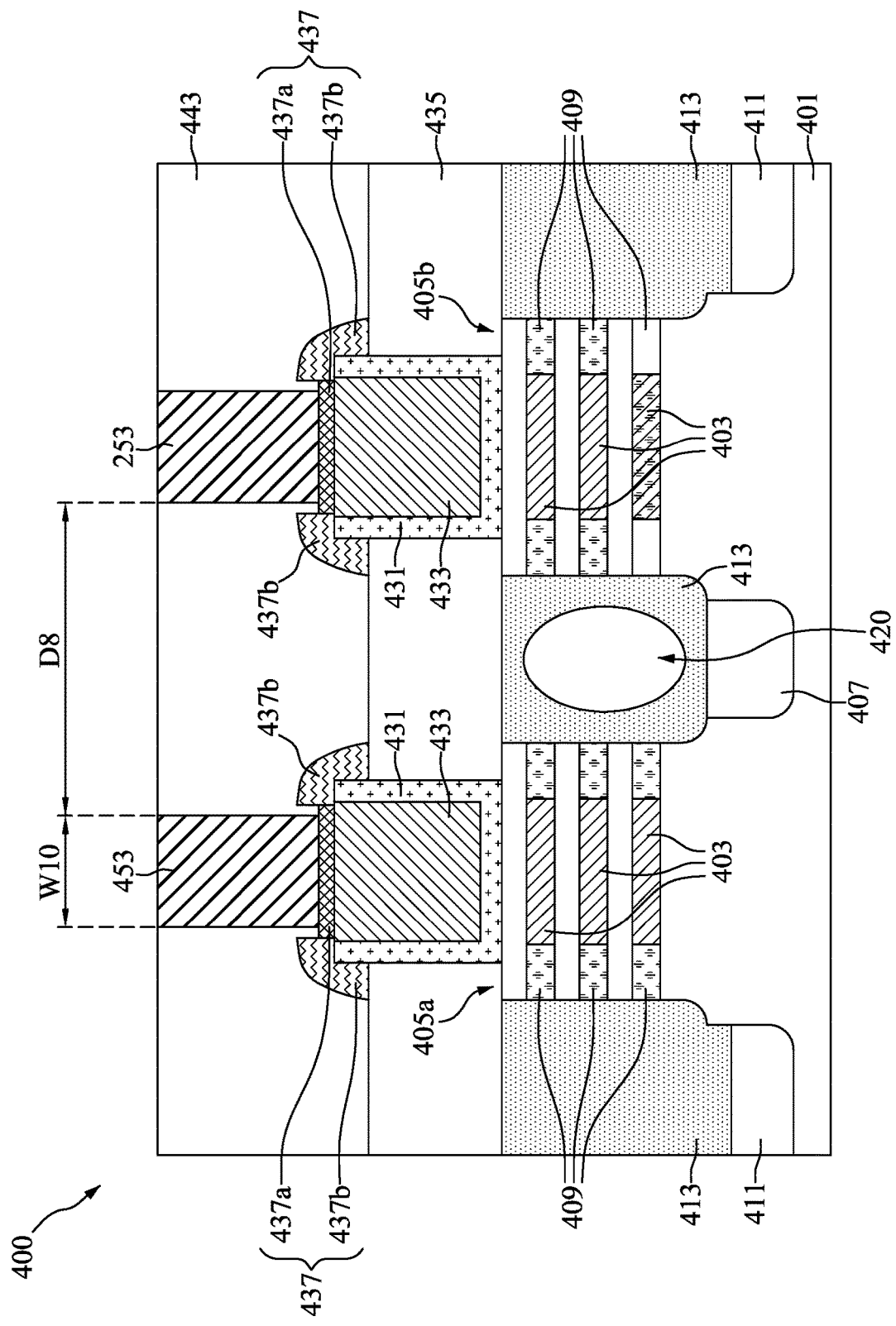
FIG. 4 is a cross-sectional view illustrating a semiconductor device, in accordance with some embodiments.

FIG. 4 is a cross-sectional view illustrating a semiconductor device 400, in accordance with some embodiments. Similar to the semiconductor device 200 of FIG. 2, the semiconductor device 400 includes a semiconductor substrate 401 which has been patterned to form a plurality of gate stacks 405a and 405b. At least one of the gate stacks 405a and 405b has a plurality of alternating stacked semiconductor layers (semiconductor substrate 401) and gate layers 403.

In some embodiments, the semiconductor device 400 also includes an inner isolation structure 407 disposed between the gate stacks 405a and 405b, and a plurality of outer isolation structures 411 disposed on the sides of the gate stacks 405a and 405b that are opposite to the sides of the inner isolation structure 407. In some embodiments, the semiconductor device 400 further includes a semiconductor material 413 disposed over the inner isolation structure 407 and the outer isolation structures 411, and the portion of the semiconductor material 413 between the gate stacks 405a and 405b includes an air gap 420. In some embodiments, the air gap 420 is enclosed by the semiconductor material 413.

In some embodiments, the top surface of the semiconductor material 413 is substantially level with the top surface of the semiconductor substrate 401 (i.e., the top surface of the gate stacks 405a and 405b). Moreover, the semiconductor device 400 further includes a plurality of inner spacers 409 stacked between the semiconductor layers (semiconductor substrate 401) of the gate stacks 405a, 405b and adjoin opposite sides of the gate layers 403.

Still referring to FIG. 4, the semiconductor device 400 includes a plurality of gate structures 433 and a plurality of barrier layers 431 disposed over at least one of the gate stacks 405a and 405b, and a dielectric layer 435 (also referred to as IMD layer) disposed over the gate stacks 405a, 405b and the semiconductor material 413 and surrounding the gate structures 433, in accordance with some embodiments. In some embodiments, the gate structures 433 are disposed over the barrier layers 431, and at least one of the barrier layers 431 extends to surround the corresponding gate structures 433. In other words, the barrier layers 431 cover the bottom surfaces and the sidewalls of the gate structures 433. In addition, it should be noted that the upper portions of the gate structures 433 and the barrier layers 431 are protruded from the dielectric layer 435. In some embodiments, the top surfaces and the upper sidewalls of the gate structures 433 and the top surfaces and the upper sidewalls of the barrier layers 431 are protruded from (i.e., not covered by) the dielectric layer 435.

In some embodiments, the semiconductor device 400 includes a plurality of landing pads 437 disposed over the gate structures 433 and the barrier layers 431, and a plurality of plugs 453 (also referred to as upper plugs) disposed over the landing pads 437. In some embodiment, the plugs 453 are electrically connected to the gate structures 433 through the landing pads 437. In some embodiments, at least one of the landing pads 437 includes outer portions 437b and an inner portion 437a disposed between the outer portions 437b. It should be noted that the inner portions 437a of the landing pads 437 are disposed over the gate structures 433, and the outer portions 437b of the landing pads 437 are disposed over the barrier layers 431. In some embodiments, the inner portions 437a are in direct contact with the top surfaces of the gate structures 433, and the outer portions 437b are in direct contact with the top surfaces and the upper sidewalls of the barrier layers 431.

In addition, the semiconductor device 400 includes a dielectric layer 443 (also referred to as IMD layer) disposed over the dielectric layer 435. In some embodiments, the gate structures 433, the landing pads 437 and the plugs 453 are disposed in the dielectric layer 443. In other words, the gate structures 433, the landing pads 437 and the plugs 453 are surrounded by the dielectric layer 443. In some embodiments, the plugs 453 are separated from the outer portions 437b of the landing pads 437 by a portion of the dielectric layer 443. However, in some other embodiments, the plugs 453 are in direct contact with the outer portions 437b of the landing pads 437.

Figure 5:
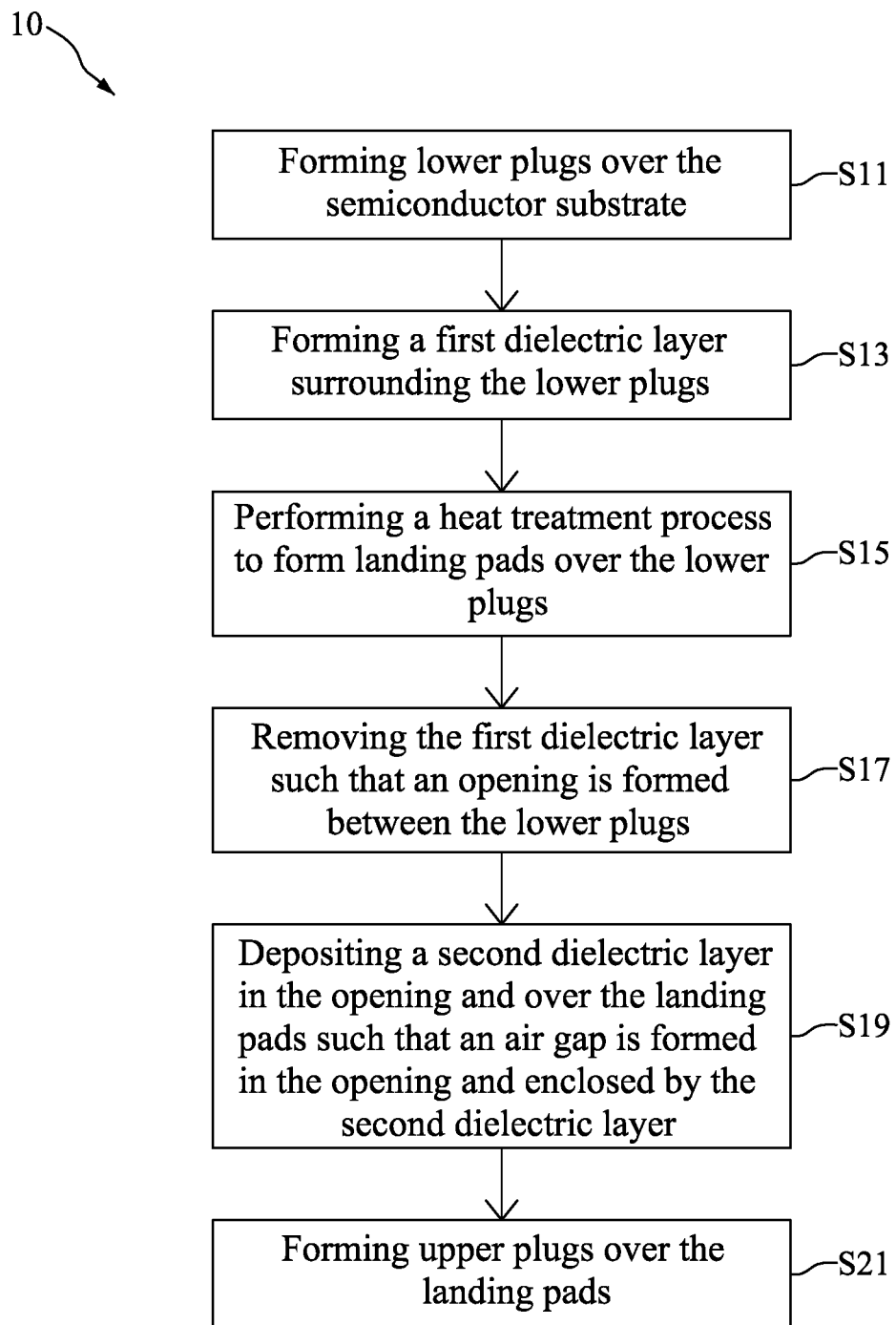
FIG. 5 is a flow diagram illustrating a method for forming a semiconductor device, in accordance with some embodiments.

FIG. 5 is a flow diagram illustrating a method 10 for forming a semiconductor device (e.g., the semiconductor device 100 of FIG. 1), and the method 10 includes steps S11, S13, S15, S17, S19 and S21, in accordance with some embodiments. The steps S11 to S21 of FIG. 5 are elaborated in connection with the following figures.

Figure 6:
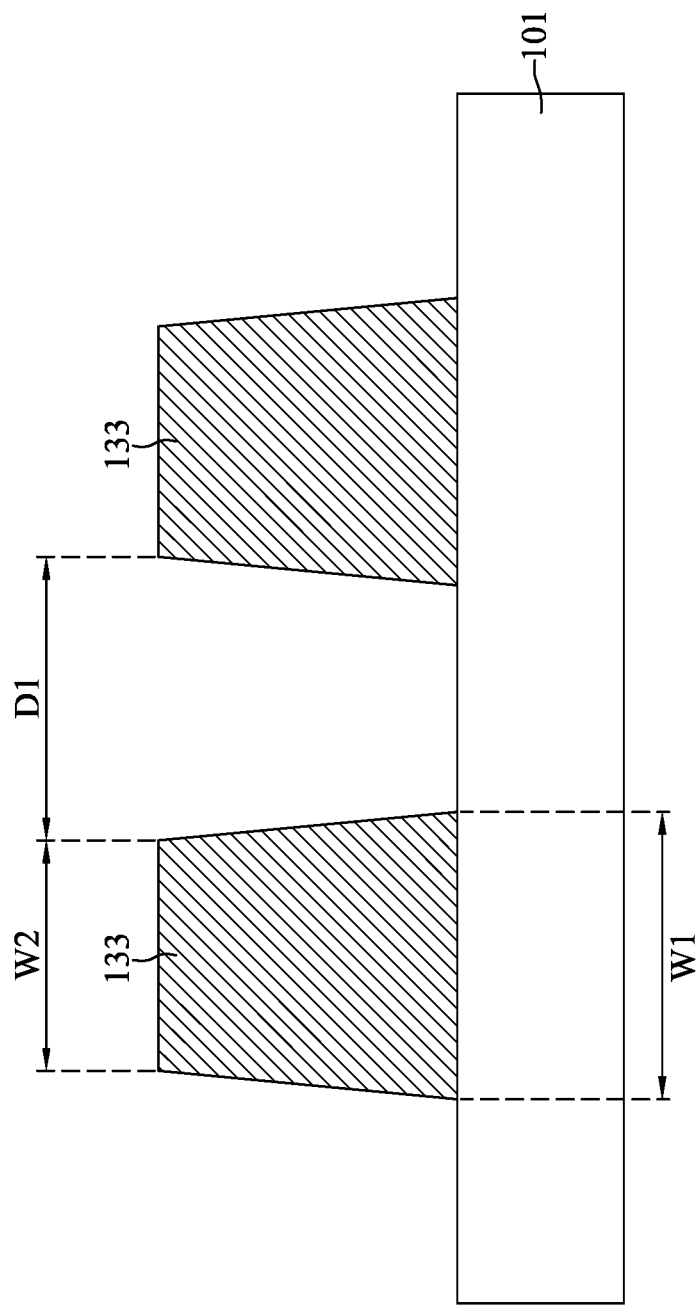
FIG. 6 is a cross-sectional view illustrating an intermediate stage of forming lower plugs during the formation of the semiconductor device, in accordance with some embodiments.

FIGS. 6-10 are cross-sectional views illustrating intermediate stages during the formation of the semiconductor device 100, in accordance with some embodiments. As shown in FIG. 6, the semiconductor substrate 101 may be a portion of an integrated circuit (IC) chip that includes various passive and active electronic elements, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field effect transistors (Fin-FETs), other suitable IC components, or combinations thereof.

Depending on the IC fabrication stage, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The semiconductor substrate 101 has been simplified for the sake of clarity. It should be noted that additional features can be added in the semiconductor substrate 101, and some of the features described below can be replaced, modified, or eliminated in other embodiments.

The lower plugs 133 are formed over the semiconductor substrate 101, as shown in FIG. 6 in accordance with some embodiments. The respective step is illustrated as the step S11 in the method 10 shown in FIG. 5. In some embodiments, the lower plugs 133 are made of a conductive material, such as copper (Cu). In some embodiments, at least one of the lower plugs 133 have a bottom width W1 and a top width W2, and the bottom width W1 is greater than the top width W2. In some embodiments, the top portions of the adjacent lower plugs 133 have a distance D1 between them. In some embodiments, the lower plugs 133 have tapered profiles tapering away from the semiconductor substrate 101.

Figure 7:
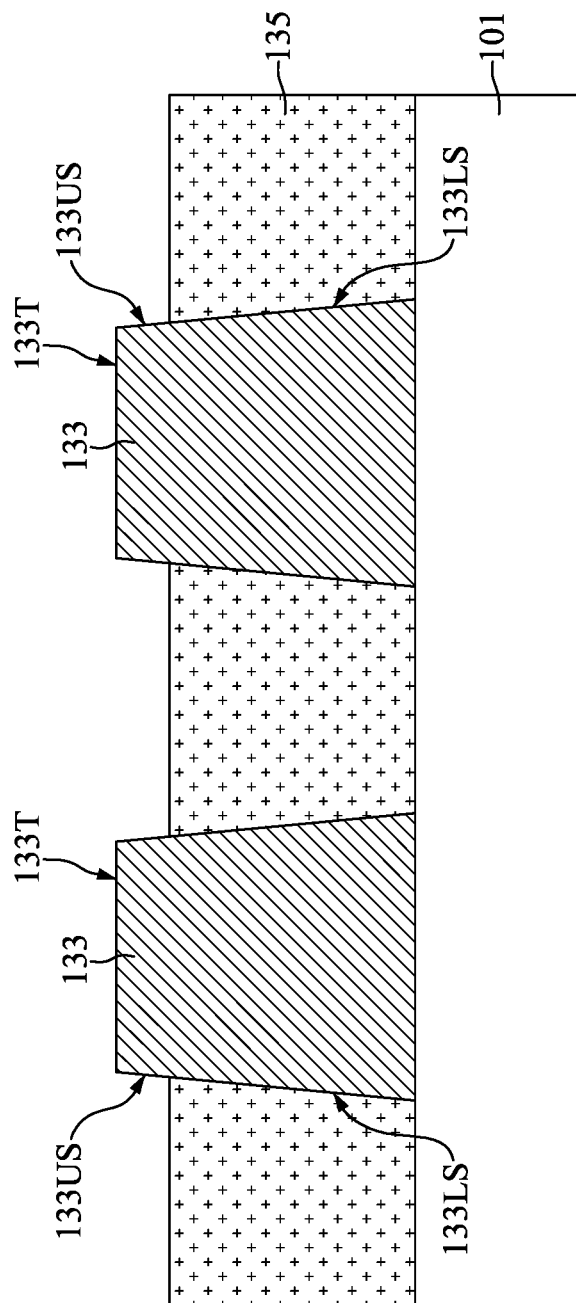
FIG. 7 is a cross-sectional view illustrating an intermediate stage of forming a first dielectric layer surrounding the lower plugs during the formation of the semiconductor device, in accordance with some embodiments.

Next, a dielectric layer 135 is formed surrounding the lower portions of the lower plugs 133 and exposing the upper portions of the lower plugs 133, as shown in FIG. 7 in accordance with some embodiments. The respective step is illustrated as the step S13 in the method 10 shown in FIG. 5. In some embodiments, the dielectric layer 135 is made of silicon oxide, silicon nitride, silicon oxynitride, silicon carbide, silicon oxycarbide, silicon carbonitride, silicon oxycarbonitride, or the like. The dielectric layer 135 is formed by depositing a dielectric material (not shown) over the semiconductor substrate 101 and the lower plugs 133 by a deposition process, such as a chemical vapor deposition (CVD) process, an atomic layer deposition (ALD) process, or a physical vapor deposition (PVD) process, and removing the upper portion of the dielectric layer 135 by a chemical mechanical polishing (CMP) process or an etch-back process.

After the upper portion of the dielectric layer 135 is removed, the upper portions of the lower plugs 133 are protruded from the dielectric layer 135. In some embodiments, the top surfaces 133T and the upper sidewalls 133US of the lower plugs 133 are protruded and exposed, while the lower sidewalls 133LS of the lower plugs 133 are covered by the dielectric layer 135, in accordance with some embodiments.

Figure 8:
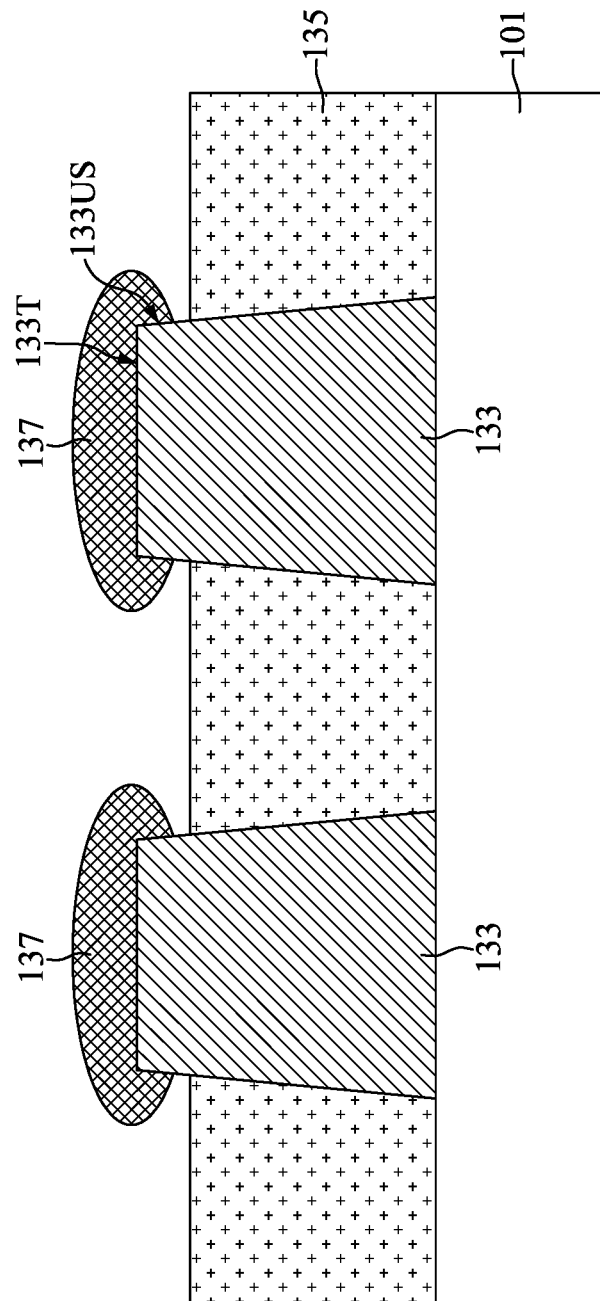
FIG. 8 is a cross-sectional view illustrating an intermediate stage of forming landing pads over the lower plugs during the formation of the semiconductor device, in accordance with some embodiments.

Subsequently, a heat treatment process is performed to form the landing pads 137 over the top surfaces 133T and the upper sidewalls 133US of the lower plugs 133, as shown in FIG. 8 in accordance with some embodiments. The respective step is illustrated as the step S15 in the method 10 shown in FIG. 5. In some embodiments, a silicon-containing gas is used during the heat treatment process to selectively form the landing pads 137 on the exposed top surfaces 133T and the exposed upper sidewalls 133US of the lower plugs 133. In some embodiments, the landing pads 137 are made of copper germanide ($Cu_3Ge$). Since the landing pads 137 provide increased landing areas for the subsequently formed upper plugs to land on, the misalignment issues between the subsequently formed upper plugs and the lower plug 133 may be prevented or reduced.

Figure 9:
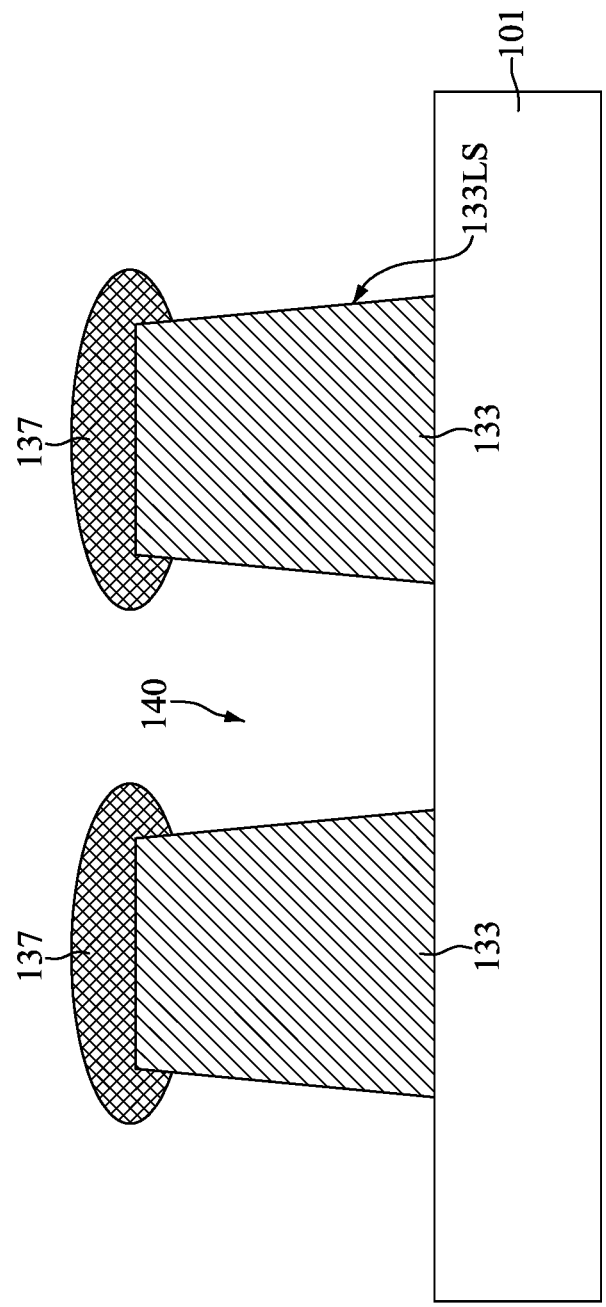
FIG. 9 is a cross-sectional view illustrating an intermediate stage of removing the first dielectric layer during the formation of the semiconductor device, in accordance with some embodiments.

After the landing pads 137 are formed, the dielectric layer 135 is removed such that an opening 140 is formed between the adjacent lower plugs 137, as shown in FIG. 9 in accordance with some embodiments. The respective step is illustrated as the step S17 in the method 10 shown in FIG. 5. In some embodiments, the dielectric layer 135 is removed by a stripping process (e.g., a wet strip process) and/or an ashing process (e.g., a plasma ashing process). Once the dielectric layer 135 is removed, the lower sidewalls 133LS of the lower plugs 133 are exposed.

Figure 10:
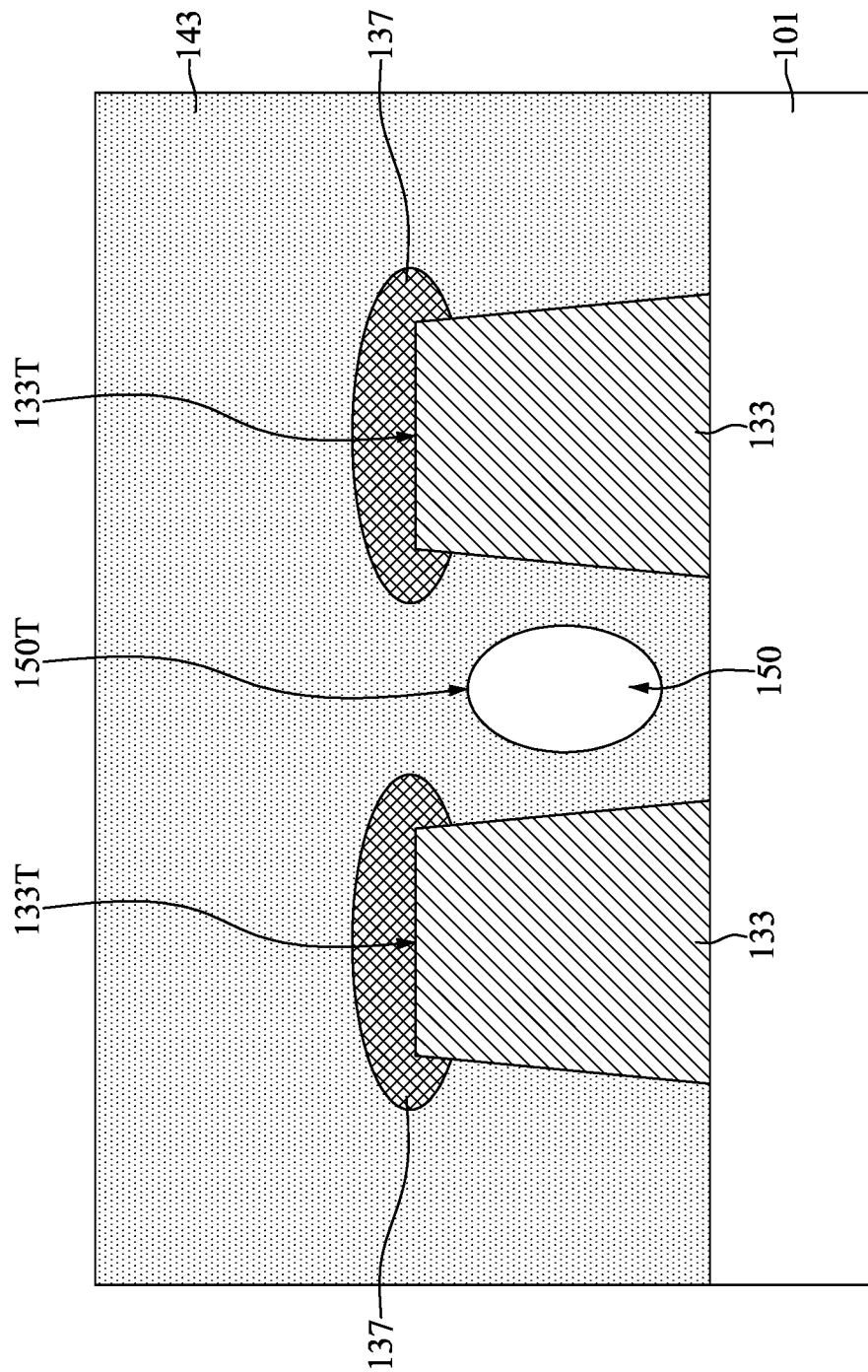
FIG. 10 is a cross-sectional view illustrating an intermediate stage of depositing a second dielectric layer such that an air gap is formed between the lower plugs during the formation of the semiconductor device, in accordance with some embodiments.

Next, the dielectric layer 143 is deposited over the structure of FIG. 9, and the air gap 150 is formed in the opening 140 between the adjacent lower plugs 133 due to an overhang effect, as shown in FIG. 10 in accordance with some embodiments. In some embodiments, the dielectric layer 143 is deposited over the semiconductor substrate 101, the lower plugs 133 and the landing pads 137, and the opening 140 (see FIG. 9) is partially filled by the dielectric layer 143. The respective step is illustrated as the step S19 in the method 10 shown in FIG. 5. In some embodiments, the exposed lower sidewalls 133LS of the lower plugs 133 are covered by the dielectric layer 143.

Moreover, in some embodiments, the air gap 150 is formed below the landing pads 137 and enclosed by the dielectric layer 143. In some embodiments, the top surfaces 133T of the lower plugs 133 are higher than the topmost surface 150T of the air gap 150. Some materials and processes used to form the dielectric layer 143 are similar to, or the same as those used to form the dielectric layer 135, and details thereof are not repeated herein. Since the lower plugs 133 have the air gap 150 between them, the parasitic capacitance between the lower plugs 133 may be reduced.

Referring back to FIG. 1, after the dielectric layer 143 is formed, the upper plugs 153 are formed in the dielectric layer 143 and over the landing pads 137, in accordance with some embodiments. The respective step is illustrated as the step S21 in the method 10 shown in FIG. 5. In some embodiments, the upper plugs 153 are made of a conductive material, such as copper (Cu), tungsten (W), aluminum (Al), titanium (Ti), tantalum (Ta), gold (Au), silver (Ag), or a combination thereof.

In addition, the upper plugs 153 may be formed by etching the dielectric layer 143 to form a plurality of openings (not shown) exposing the corresponding landing pads 137, depositing a conductive material (not shown) in the openings and over the dielectric layer 143, and planarizing the conductive material such that the top surfaces of the remaining conductive material (i.e., the upper plugs 153) are substantially level with the top surface of the dielectric layer 143. After the upper plugs 153 are formed, the semiconductor device 100 is obtained. Referring to FIGS. 1 and 6, at least one of the widths W1 and W2 of the lower plug 133 is greater than the width W3 of the upper plug 153, and the distance D2 between the adjacent upper plugs 153 is greater than the distance D1 between the adjacent lower plugs 133.

Figure 11:
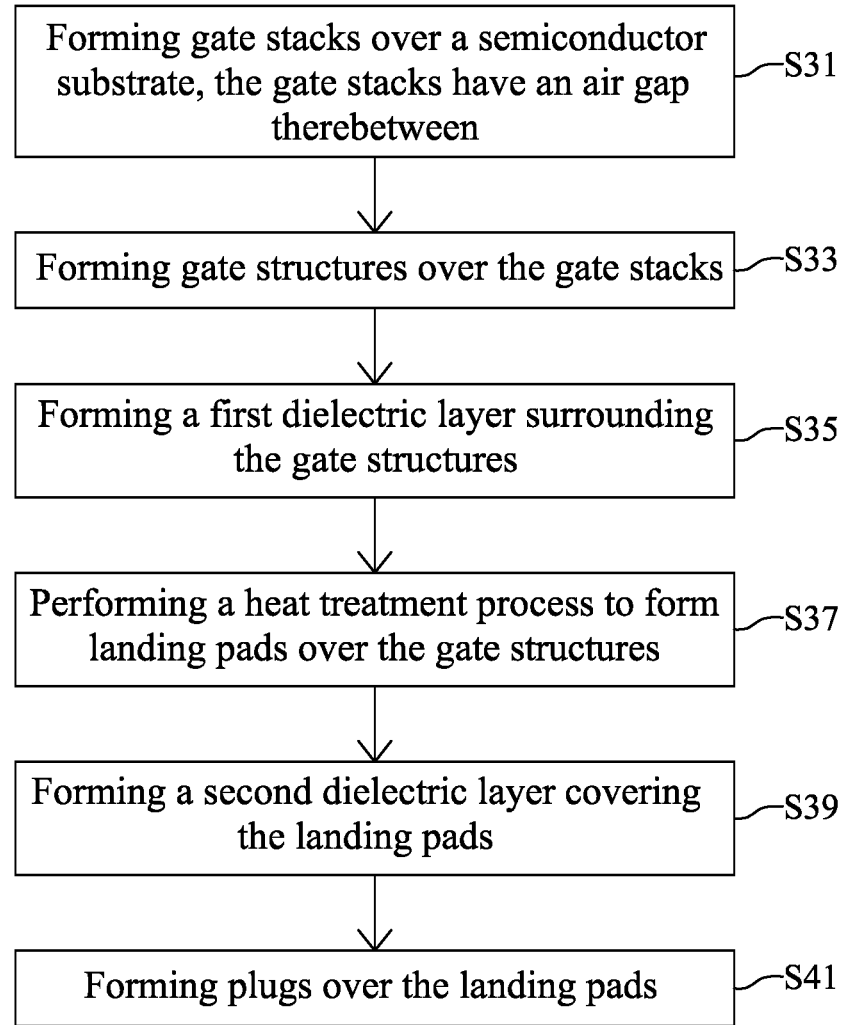
FIG. 11 is a flow diagram illustrating a method for forming a semiconductor device, in accordance with some embodiments.

FIG. 11 is a flow diagram illustrating a method 30 for forming a semiconductor device (e.g., the semiconductor device 200 of FIG. 2), and the method 30 includes steps S31, S33, S35, S37, S39 and S41, in accordance with some embodiments. The steps S31 to S41 of FIG. 11 are elaborated in connection with the following figures.

Figure 12:
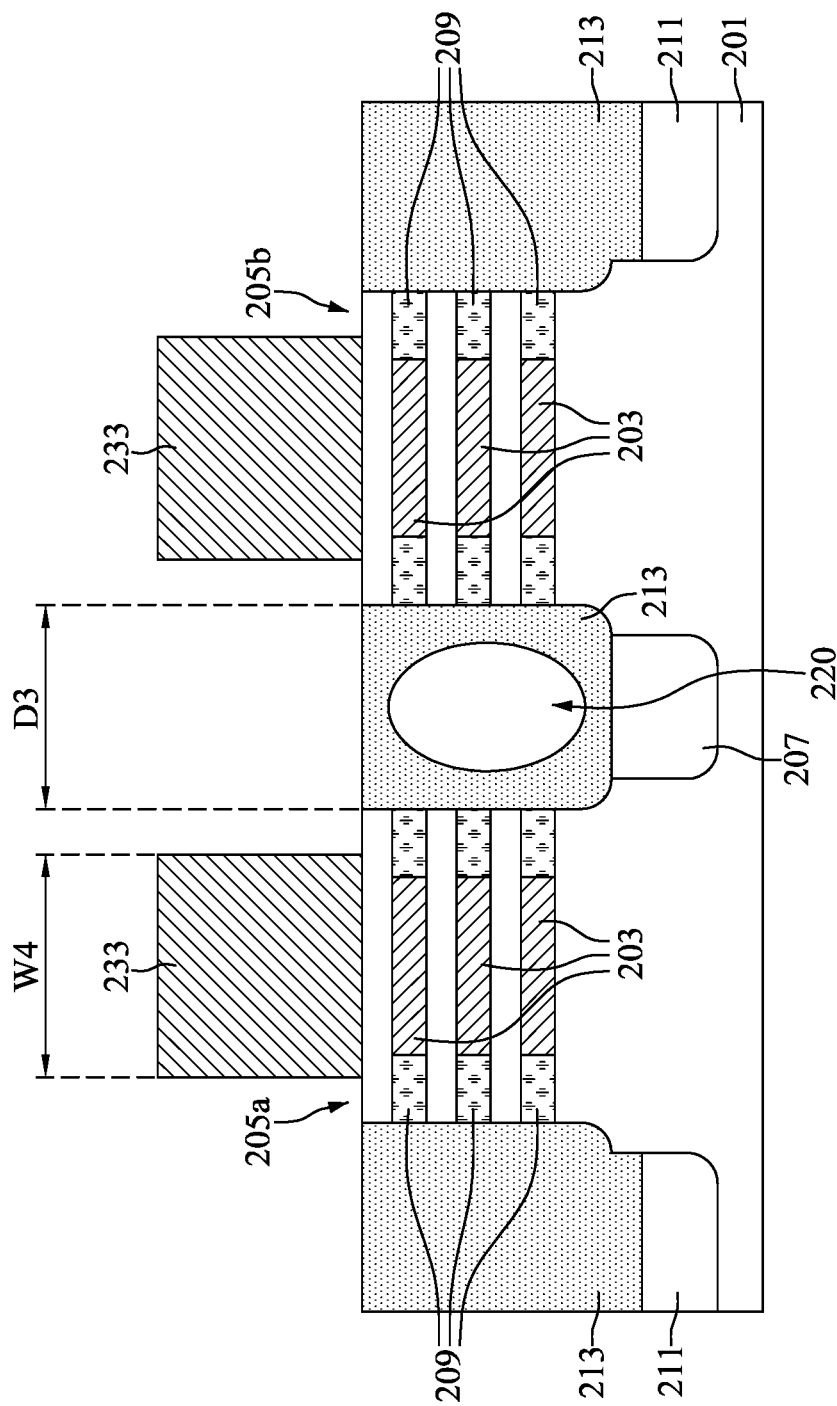
FIG. 12 is a cross-sectional view illustrating an intermediate stage of forming gate structures over gate stacks during the formation of the semiconductor device, in accordance with some embodiments.
Figure 13:
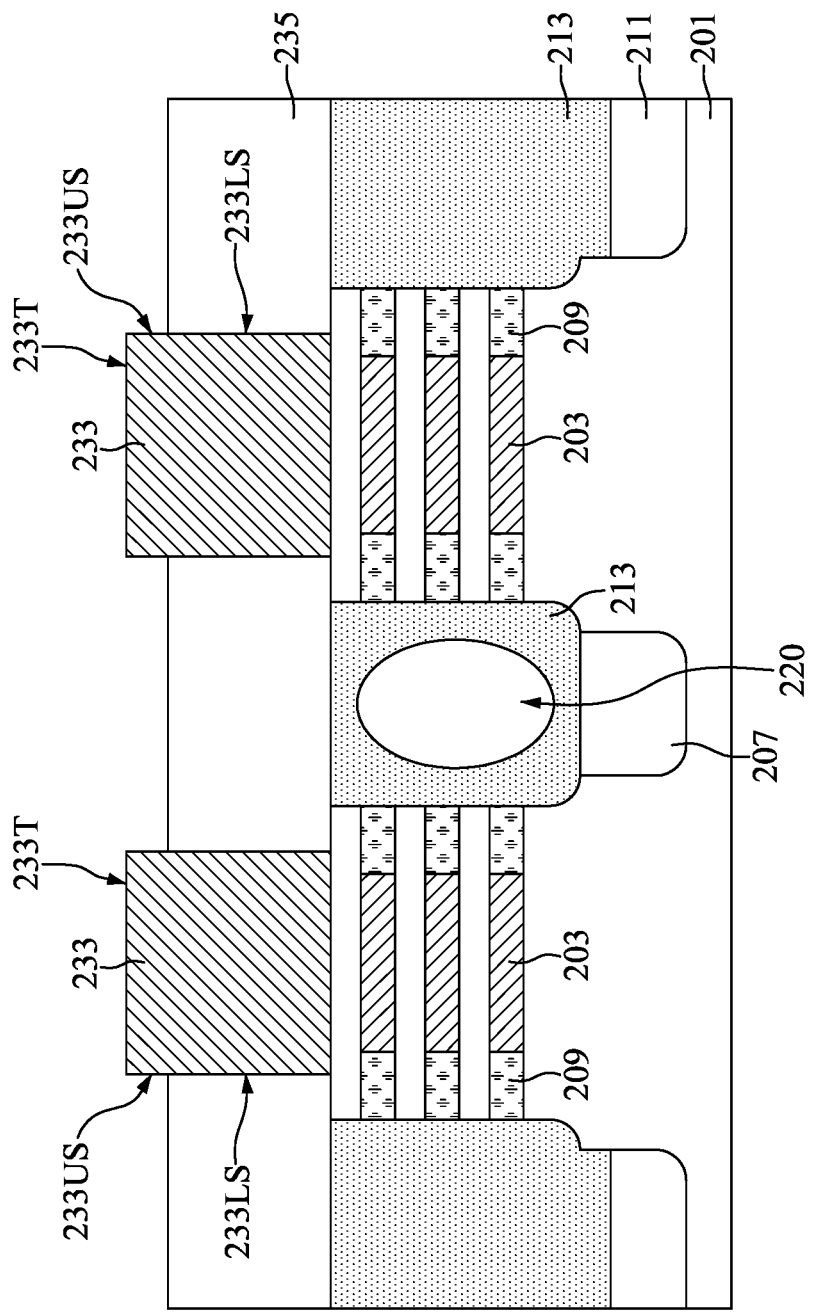
FIG. 13 is a cross-sectional view illustrating an intermediate stage of forming a first dielectric layer surrounding the gate structures during the formation of the semiconductor device, in accordance with some embodiments.
Figure 14:
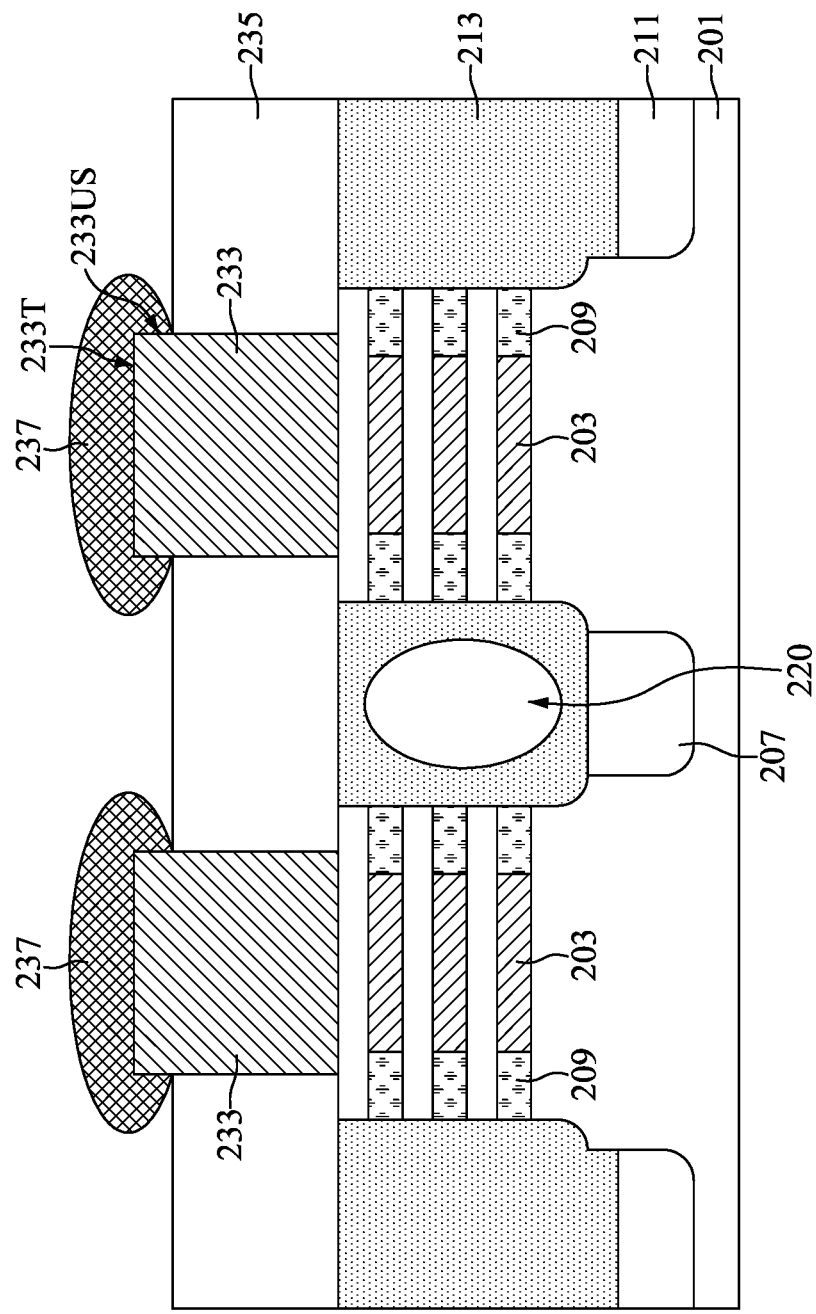
FIG. 14 is a cross-sectional view illustrating an intermediate stage of forming landing pads over the gate structures during the formation of the semiconductor device, in accordance with some embodiments.

FIGS. 12-14 are cross-sectional views illustrating intermediate stages during the formation of the semiconductor device 200, in accordance with some embodiments. As shown in FIG. 12, the semiconductor substrate 201 is patterned to form the gate stacks 205a and 205b and the gate structures 233 are formed over the gate stacks 205a and 205b, in accordance with some embodiments.

The semiconductor substrate 201 may be a semiconductor wafer such as a silicon wafer. Alternatively or additionally, the semiconductor substrate 201 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 201 includes an epitaxial layer. For example, the semiconductor substrate 201 has an epitaxial layer overlying a bulk semiconductor. In some embodiments, the semiconductor substrate 201 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other applicable methods.

The semiconductor layers (semiconductor substrate 201) and the gate layers 203 are alternating stacked in the gate stacks 205a and 205b, and the inner spacers 209 are formed on opposite sides of the gate layers 203 and sandwiched between the semiconductor layers (semiconductor substrate 201) in the gate stacks 205a and 205b. In some embodiments, the inner spacers 209 are made of silicon oxide, silicon nitride, or another applicable dielectric material. The inner spacers 209 may be formed by laterally recessing the gate layers 203 from sides of the gate layers 203 to form a plurality of gaps between the semiconductor layers (semiconductor substrate 201) of the gate stacks 205a and 205b, depositing a dielectric material in the gaps, and removing the excess portions of the dielectric material outside of the gaps.

Some materials and the processes used to form the inner isolation structure 207 and the outer isolation structures 211 are similar to those used to form the inner spacers 209, and details thereof are not repeated herein. Moreover, the semiconductor material 213 is formed over the inner isolation structure 207 and the outer isolation structures 211, and an air gap 220 is formed over the inner isolation structure 207 due to the high aspect ratio of the opening between the gate stacks 205a and 205b. In some embodiments, the air gap 220 is enclosed by the semiconductor material 213.

The semiconductor material 213 may be any suitable material, including but not limited to, silicon (Si) or silicon germanium (SiGe). The semiconductor material 213 may be formed by a deposition process, such as a CVD process, an ALD process, or a PVD process. The semiconductor material 213 may be formed by a deposition process, and a subsequent planarization process (e.g., a CMP process). After the semiconductor material 213 is formed, the gate structures 233 are formed over the gate stacks 205a and 205b. The respective steps are illustrated as the steps S31 and S33 in the method 30 shown in FIG. 11.

In some embodiments, the gate structures 233 are made of a conductive material, such as copper (Cu). In some embodiments, at least one of the gate structures 233 have a width W4. In some embodiments, the top portions of the adjacent gate structures 233 have a distance D3 between them. It should be noted that since the gate stacks 205a and 205b have the air gap 220 between them, the parasitic capacitance between the gate stacks 205a and 205b may be reduced.

Next, the dielectric layer 235 is formed surrounding the lower portions of the gate structures 233 and exposing the upper portions of the gate structures 233, as shown in FIG. 13 in accordance with some embodiments. The respective step is illustrated as the step S35 in the method 30 shown in FIG. 11. In some embodiments, the dielectric layer 235 is made of silicon oxide, silicon nitride, silicon oxynitride, silicon carbide, silicon oxycarbide, silicon carbonitride, silicon oxycarbonitride, or the like. The dielectric layer 235 is formed by depositing a dielectric material (not shown) over the semiconductor material 213, the gate stacks 205a, 205b and the gate structures 233 by a deposition process, such as a CVD process, an ALD process, or a physical vapor deposition PVD process, and removing the upper portion of the dielectric layer 235 by a CMP process or an etch-back process.

After the upper portion of the dielectric layer 235 is removed, the upper portions of the gate structures 233 are protruded from the dielectric layer 235. In some embodiments, the top surfaces 233T and the upper sidewalls 233US of the gate structures 233 are protruded and exposed, while the lower sidewalls 233LS of the gate structures 233 are covered by the dielectric layer 235, in accordance with some embodiments.

Subsequently, a heat treatment process is performed to form the landing pads 237 over the top surfaces 233T and the upper sidewalls 233US of the gate structures 233, as shown in FIG. 14 in accordance with some embodiments. The respective step is illustrated as the step S37 in the method 30 shown in FIG. 11. In some embodiments, a silicon-containing gas is used during the heat treatment process to selectively form the landing pads 237 on the exposed top surfaces 233T and the exposed upper sidewalls 233US of the gate structures 233. In some embodiments, the landing pads 237 are made of copper germanide ($Cu_3Ge$). Since the landing pads 237 provide increased landing areas for the subsequently formed plugs to land on, the misalignment issues between the subsequently formed plugs and the gate structures 233 may be prevented or reduced.

Referring back to FIG. 2, the dielectric layer 243 is formed over the dielectric layer 235 and covering the landing pads 237, and the plugs 253 are formed in the dielectric layer 243 and over the landing pads 237, in accordance with some embodiments. The respective steps are illustrated as the steps S39 and S41 in the method 30 shown in FIG. 11. Some materials and processes used to form the dielectric layer 243 are similar to, or the same as those used to form the dielectric layer 235, and details thereof are not repeated herein. In some embodiments, the plugs 253 are made of a conductive material, such as copper (Cu), tungsten (W), aluminum (Al), titanium (Ti), tantalum (Ta), gold (Au), silver (Ag), or a combination thereof.

In addition, the plugs 253 may be formed by etching the dielectric layer 243 to form a plurality of openings (not shown) exposing the corresponding landing pads 237, depositing a conductive material (not shown) in the openings and over the dielectric layer 243, and planarizing the conductive material such that the top surfaces of the remaining conductive material (i.e., the plugs 253) are substantially level with the top surface of the dielectric layer 243. After the plugs 253 are formed, the semiconductor device 200 is obtained. Referring to FIGS. 2 and 12, the width W4 of the gate structure 233 is greater than the width W5 of the plug 253, and the distance D4 between the adjacent plugs 253 is greater than the distance D3 between the adjacent gate stacks 205a and 205b.

Figure 15:
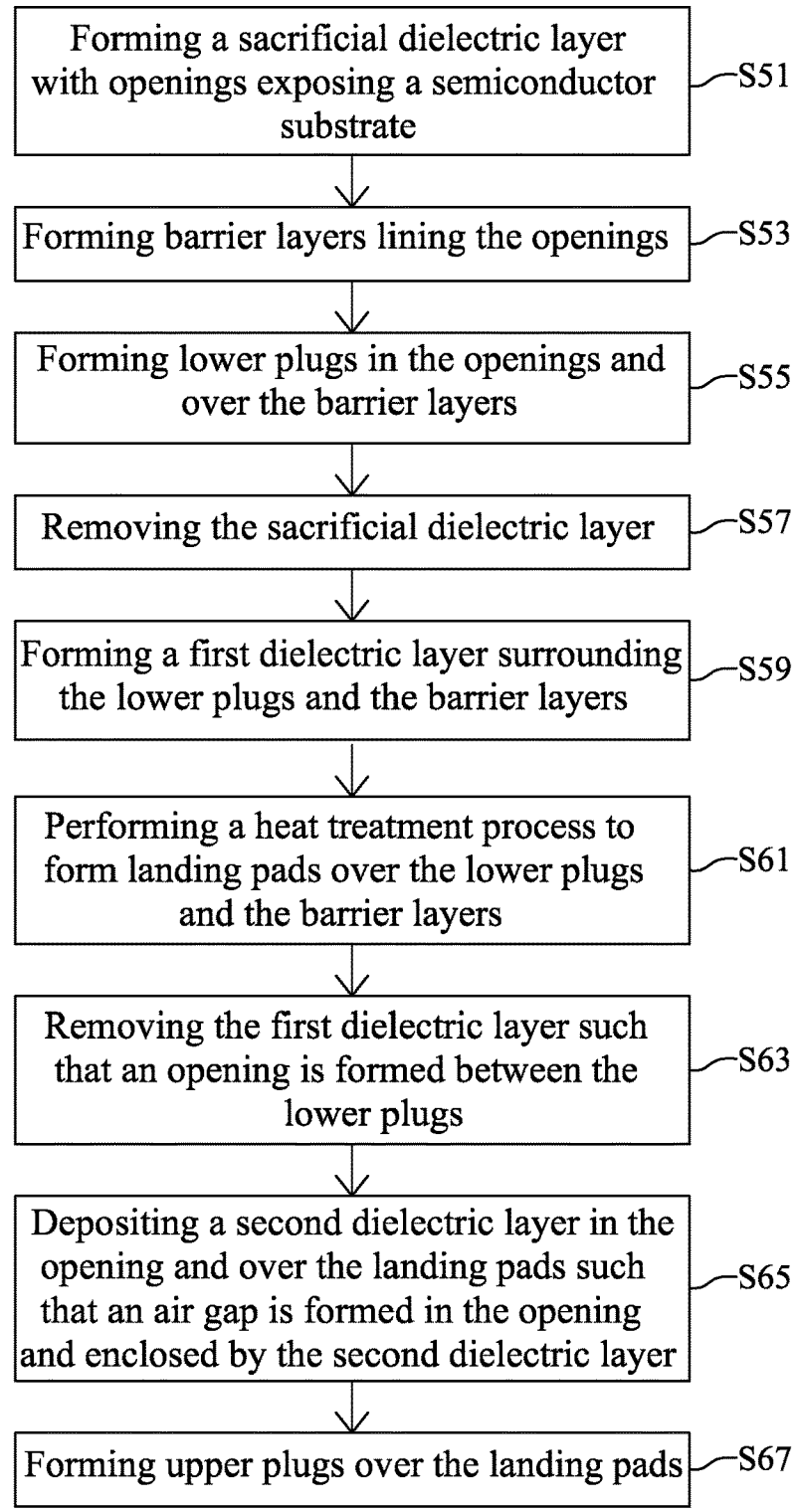
FIG. 15 is a flow diagram illustrating a method for forming a semiconductor device, in accordance with some embodiments.

FIG. 15 is a flow diagram illustrating a method 50 for forming a semiconductor device (e.g., the semiconductor device 300 of FIG. 3), and the method 50 includes steps S51, S53, S55, S57, S59, S61, S63, S65 and S67, in accordance with some embodiments. The steps S51 to S67 of FIG. 15 are elaborated in connection with the following figures.

Figure 16:
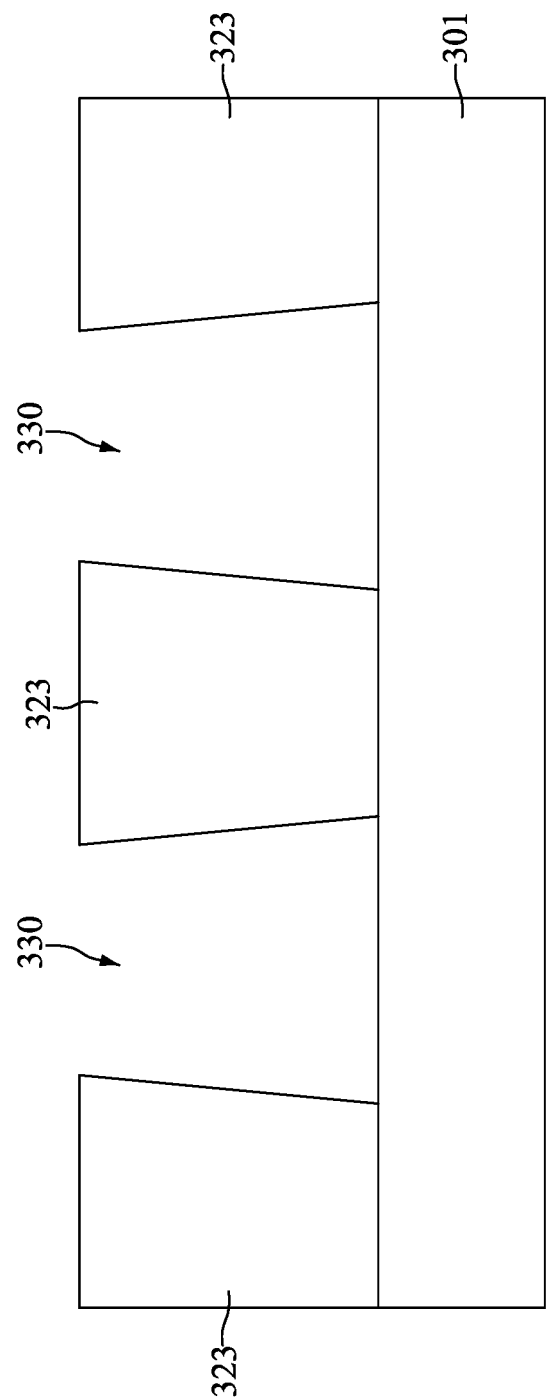
FIG. 16 is a cross-sectional view illustrating an intermediate stage of forming a sacrificial dielectric layer with openings exposing a semiconductor substrate during the formation of the semiconductor device, in accordance with some embodiments.

FIGS. 16-22 are cross-sectional views illustrating intermediate stages during the formation of the semiconductor device 300, in accordance with some embodiments. As shown in FIG. 16, a sacrificial dielectric layer 323 with openings 330 is formed over the semiconductor substrate 301, in accordance with some embodiments. In some embodiments, the semiconductor substrate 301 is partially exposed by at least one of the openings 330. The respective step is illustrated as the step S51 in the method 50 shown in FIG. 15.

The semiconductor substrate 301 may be similar to the semiconductor substrate 101 described above and the description is not repeated herein. The sacrificial dielectric layer 323 may be made of silicon oxide, silicon nitride, silicon oxynitride, silicon carbide, silicon oxycarbide, silicon carbonitride, silicon oxycarbonitride, or the like. In some embodiments, the sacrificial dielectric layer 323 is formed by depositing a dielectric material (not shown) over the semiconductor substrate 301, and etching the dielectric material by an anisotropic etching process to form the openings 330, such that the openings 330 have tapered profiles tapering away from the semiconductor substrate 301.

In some other embodiments, the sacrificial dielectric layer 323 is formed by forming sacrificial patterns (not shown) over the semiconductor substrate 301, forming a sacrificial dielectric material (not shown) surrounding the sacrificial patterns, planarizing the sacrificial dielectric material such that the top surface of the remaining sacrificial dielectric material (i.e., the sacrificial dielectric layer 323) is substantially level with the top surfaces of the sacrificial patterns, and removing the sacrificial patterns.

Next, the barrier layers 331 are formed lining the bottom surface and the sidewalls of the openings 330, and the lower plugs 333 are formed over and surrounded by the barrier layers 331. The respective steps are illustrated as the steps S53 and S55 in the method 50 shown in FIG. 15. In some embodiments, the barrier layers 331 are made of a titanium-containing material, such as titanium (Ti) or titanium nitride (TiN), and the lower plugs 333 are made of copper (Cu). The barrier layers 331 and the lower plugs 333 may be formed by deposition processes, such as CVD, ALD, PVD, sputtering, or plating. After the deposition processes, a planarization process (e.g., a CMP process) may be performed such that the top surfaces of the barrier layers 331 and the top surfaces of the lower plugs 333 are substantially level with the top surface of the sacrificial dielectric layer 323.

In some embodiments, at least one of the lower plugs 333 and the corresponding barrier layers 331 collectively have a bottom width W6 and a top width W7, and the bottom width W6 is greater than the top width W7. That is, at least one of the lower plugs 333 and the corresponding barrier layers 331 collectively have tapered profiles tapering away from the semiconductor substrate 101, in accordance with some embodiments. Since the thicknesses of the barrier layers 331 are too small compared to the thicknesses of the lower plugs 333, the bottom width of at least one of the lower plugs 333 may be substantially the same as the width W6, and the top width of at least one of the lower plugs 333 may be substantially the same as the width W7. In other words, the bottom widths of the lower plugs 333 are greater than the top widths of the lower plugs 333, and at least one of the lower plugs 333 has a tapered profile tapering away from the semiconductor substrate 101.

In addition, in some embodiments, the top portions of the adjacent barrier layers 331 have a distance D5 between them. Since the thicknesses of the barrier layers 331 are too small compared to the thicknesses of the lower plugs 333, the distance between the adjacent lower plugs 333 is substantially the same as the distance D5.

Figure 18:
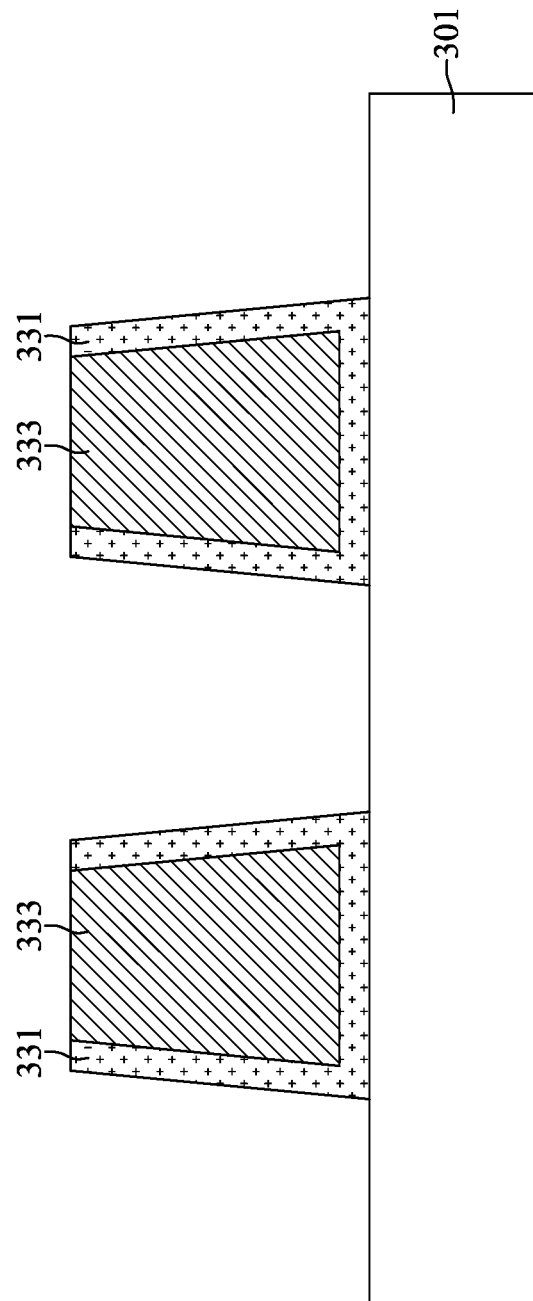
FIG. 18 is a cross-sectional view illustrating an intermediate stage of removing the sacrificial dielectric layer during the formation of the semiconductor device, in accordance with some embodiments.

After the barrier layers 331 and the lower plugs 333 are formed, the sacrificial dielectric layer 323 is removed, as shown in FIG. 18 in accordance with some embodiments. The respective step is illustrated as the step S57 in the method 50 shown in FIG. 15. In some embodiments, the sacrificial dielectric layer 323 is removed by a stripping process (e.g., a wet strip process) and/or an ashing process (e.g., a plasma ashing process).

Figure 19:
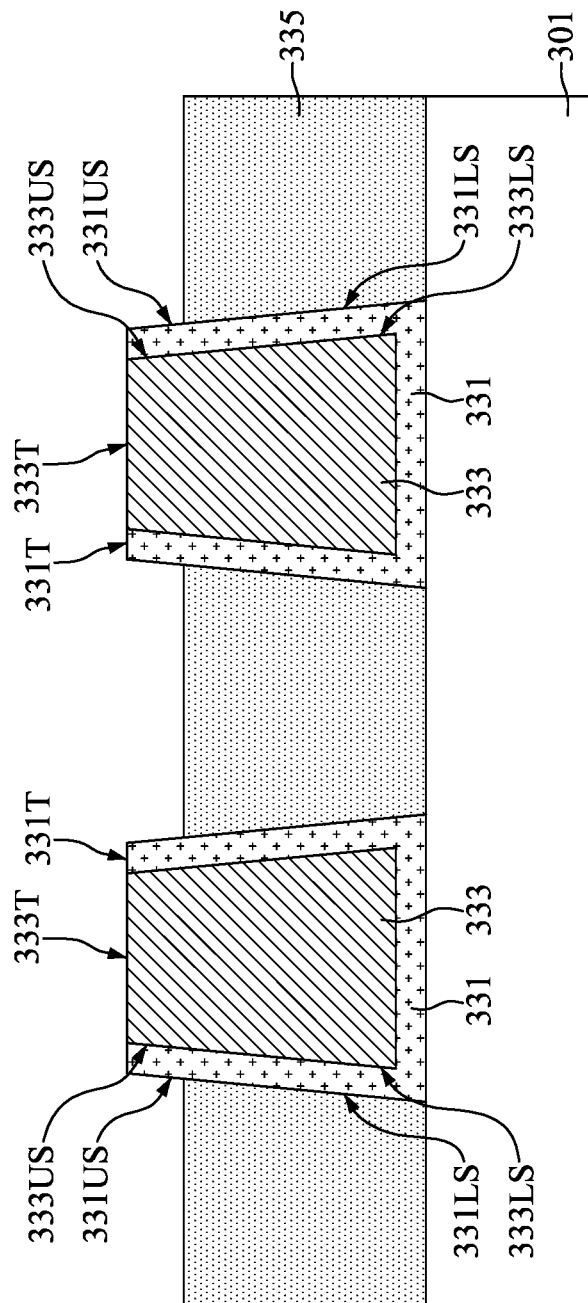
FIG. 19 is a cross-sectional view illustrating an intermediate stage of forming a first dielectric layer surrounding the lower plugs and the barrier layers during the formation of the semiconductor device, in accordance with some embodiments.

Subsequently, the dielectric layer 335 is formed surrounding the lower portions of the lower plugs 333 and the barrier layers 331 and exposing the upper portions of the lower plugs 333 and the barrier layers 331, as shown in FIG. 19 in accordance with some embodiments. The respective step is illustrated as the step S59 in the method 50 shown in FIG. 15. Some materials and processes used to form the dielectric layer 335 are similar to, or the same as those used to form the sacrificial dielectric layer 323, and details thereof are not repeated herein. The dielectric layer 335 is formed by depositing a dielectric material (not shown) over the semiconductor substrate 301, the lower plugs 333 and the barrier layers 331 by a deposition process, such as a CVD process, an ALD process, or a PVD process, and removing the upper portion of the dielectric layer 335 by a CMP process or an etch-back process.

After the upper portion of the dielectric layer 335 is removed, the upper portions of the lower plugs 333 and the upper portions of the barrier layers 331 are protruded from the dielectric layer 335. In some embodiments, the top surfaces 333T and the upper sidewalls 333US of the lower plugs 333, and the top surfaces 331T and the upper sidewalls 331US of the barrier layers 331 are protruded (and/or exposed), while the lower sidewalls 333LS of the lower plugs 333 and the lower sidewalls 331LS of the barrier layers 331 are covered by the dielectric layer 335, in accordance with some embodiments.

In some embodiments, the formation of the dielectric layer 335 is omitted. In these cases, the sacrificial dielectric layer 323 are partially removed such that the lower portion of the sacrificial dielectric layer 323 remains covering the lower sidewalls 331LS of the barrier layers 331 and the lower sidewalls 333LS of the lower plugs 333.

Figure 20:
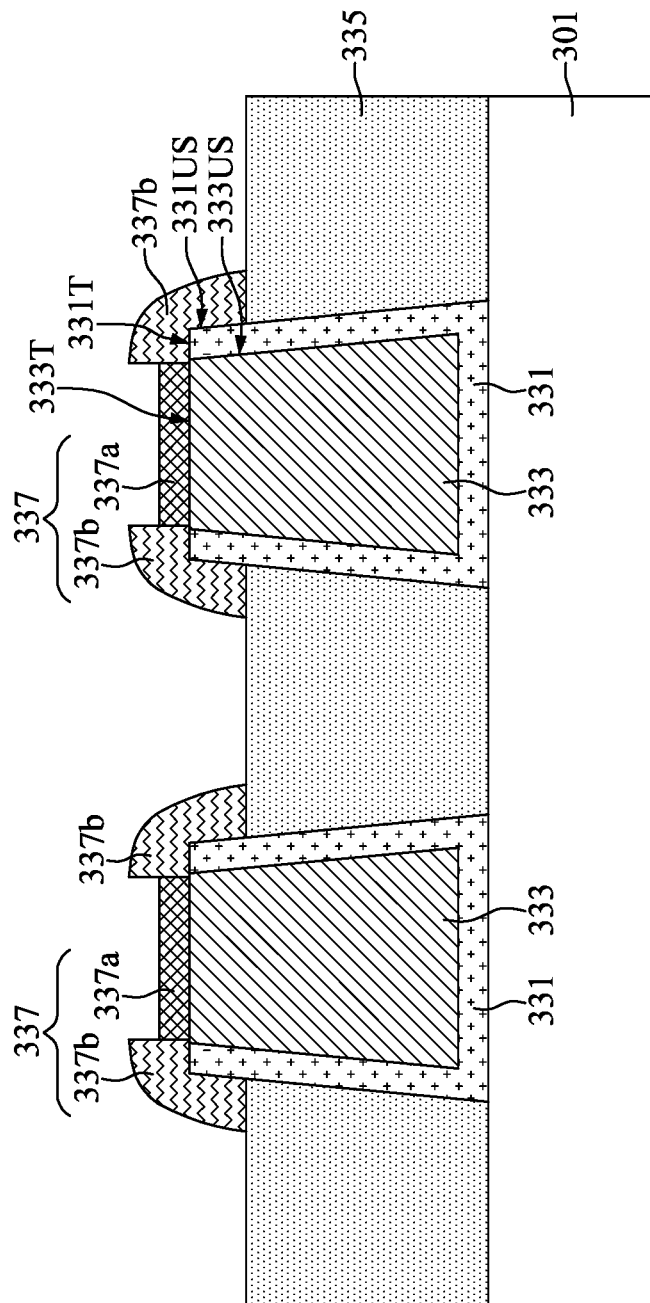
FIG. 20 is a cross-sectional view illustrating an intermediate stage of forming landing pads over the lower plugs and the barrier layers during the formation of the semiconductor device, in accordance with some embodiments.

Then, a heat treatment process is performed to form the landing pads 337 over the top surfaces 333T and the upper sidewalls 333US of the lower plugs 333 and over the top surfaces 331T and the upper sidewalls 331US of the barrier layers 331, as shown in FIG. 20 in accordance with some embodiments. The respective step is illustrated as the step S61 in the method 50 shown in FIG. 15. In some embodiments, at least one of the landing pads 337 includes the outer portions 337b and the inner portion 337a disposed between the outer portions 337b.

In some embodiments, a silicon-containing gas is used during the heat treatment process to selectively form the inner portions 337a of the landing pads 337 on the exposed top surfaces 333T of the lower plugs 333, and selectively form the outer portions 337b of the landing pads 337 on the exposed top surfaces 331T and the upper sidewalls 331US of the barrier layers 331. In some embodiments, the inner portions 337a and the outer portions 337b are made of different materials, but they are simultaneously formed by the heat treatment process. In some embodiments, the inner portions 337a are made of tungsten silicide (WSi), and the outer portions 337b are made of titanium silicide (TiSi). Since the landing pads 337 provide increased landing areas for the subsequently formed upper plugs to land on, the misalignment issues between the subsequently formed upper plugs and the lower plugs 333 may be prevented or reduced.

Figure 21:
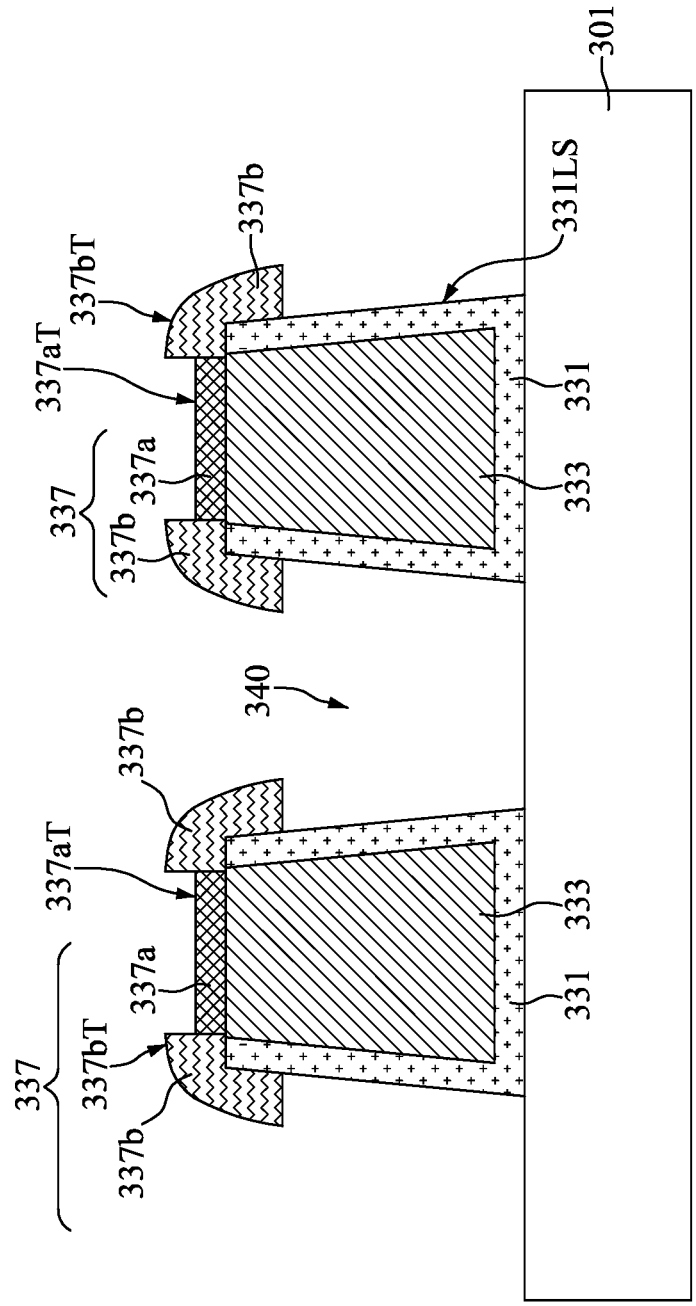
FIG. 21 is a cross-sectional view illustrating an intermediate stage of removing the first dielectric layer during the formation of the semiconductor device, in accordance with some embodiments.

After the landing pads 337 are formed, the dielectric layer 335 is removed such that an opening 340 is formed between the adjacent lower plugs 337 (or between the adjacent barrier layers 331 surrounding the lower plugs 337), as shown in FIG. 21 in accordance with some embodiments. The respective step is illustrated as the step S63 in the method 50 shown in FIG. 15. In some embodiments, the dielectric layer 335 is removed by a stripping process (e.g., a wet strip process) and/or an ashing process (e.g., a plasma ashing process). Once the dielectric layer 335 is removed, the lower sidewalls 331LS of the barrier layers 331 are exposed.

Figure 22:
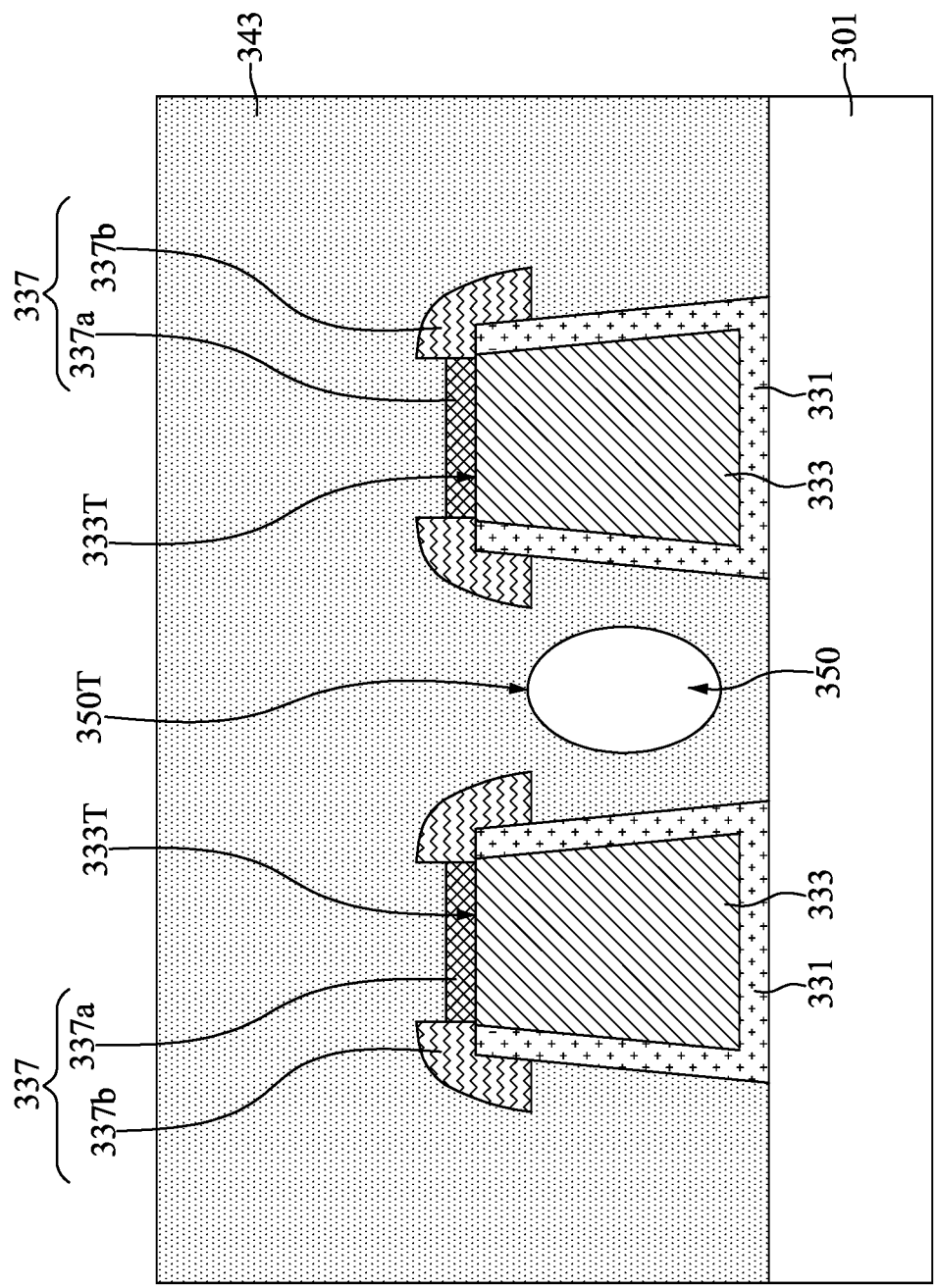
FIG. 22 is a flow diagram illustrating a method for forming a semiconductor device, in accordance with some embodiments.

Next, the dielectric layer 343 is deposited over the structure of FIG. 21, and the air gap 350 is formed in the opening 340 between the adjacent lower plugs 333 (or between the adjacent barrier layers 331) due to an overhang effect, as shown in FIG. 22 in accordance with some embodiments. In some embodiments, the dielectric layer 343 is deposited over the semiconductor substrate 301, the lower plugs 333, the barrier layers 331 and the landing pads 337, and the opening 340 (see FIG. 21) is partially filled by the dielectric layer 343. The respective step is illustrated as the step S65 in the method 50 shown in FIG. 15. In some embodiments, the exposed lower sidewalls 331LS of the barrier layers 331 are covered by the dielectric layer 343.

Moreover, in some embodiments, the air gap 350 is formed below the landing pads 337 and enclosed by the dielectric layer 343. In some embodiments, the top surfaces 333T of the lower plugs 333 are higher than the topmost surface 350T of the air gap 350. Some materials and processes used to form the dielectric layer 343 are similar to, or the same as those used to form the dielectric layer 335, and details thereof are not repeated herein. Since the lower plugs 333 have the air gap 350 between them, the parasitic capacitance between the lower plugs 333 may be reduced.

Referring back to FIG. 3, after the dielectric layer 343 is formed, the upper plugs 353 are formed in the dielectric layer 343 and over the landing pads 337, in accordance with some embodiments. The respective step is illustrated as the step S67 in the method 50 shown in FIG. 15. In some embodiments, the upper plugs 353 are made of a conductive material, such as copper (Cu), tungsten (W), aluminum (Al), titanium (Ti), tantalum (Ta), gold (Au), silver (Ag), or a combination thereof.

Figure 17:
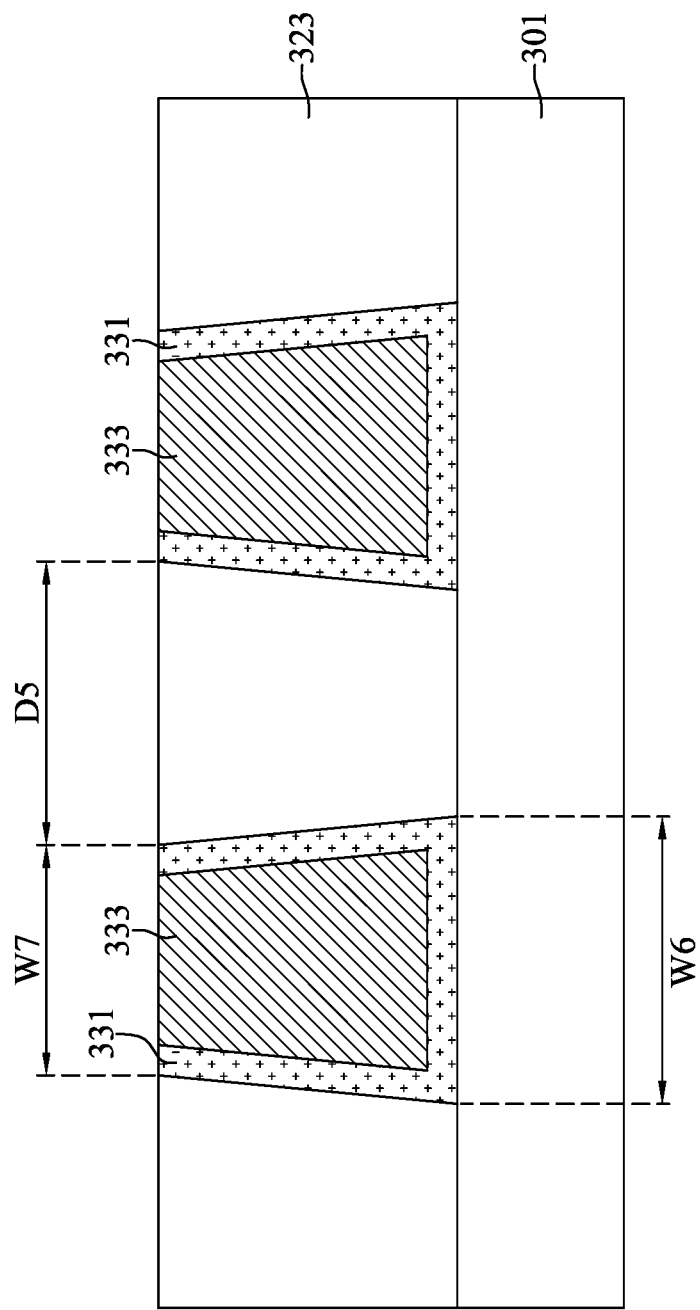
FIG. 17 is a cross-sectional view illustrating an intermediate stage of forming barrier layers and lower plugs in the openings during the formation of the semiconductor device, in accordance with some embodiments.

In addition, the upper plugs 353 may be formed by etching the dielectric layer 343 to form a plurality of openings (not shown) exposing the corresponding landing pads 337, depositing a conductive material (not shown) in the openings and over the dielectric layer 343, and planarizing the conductive material such that the top surfaces of the remaining conductive material (i.e., the upper plugs 353) are substantially level with the top surface of the dielectric layer 343. After the upper plugs 353 are formed, the semiconductor device 300 is obtained. Referring to FIGS. 3 and 17, at least one of the widths W6 and W7 is greater than the width W8, and the distance D6 is greater than the distance D5.

Figure 23:
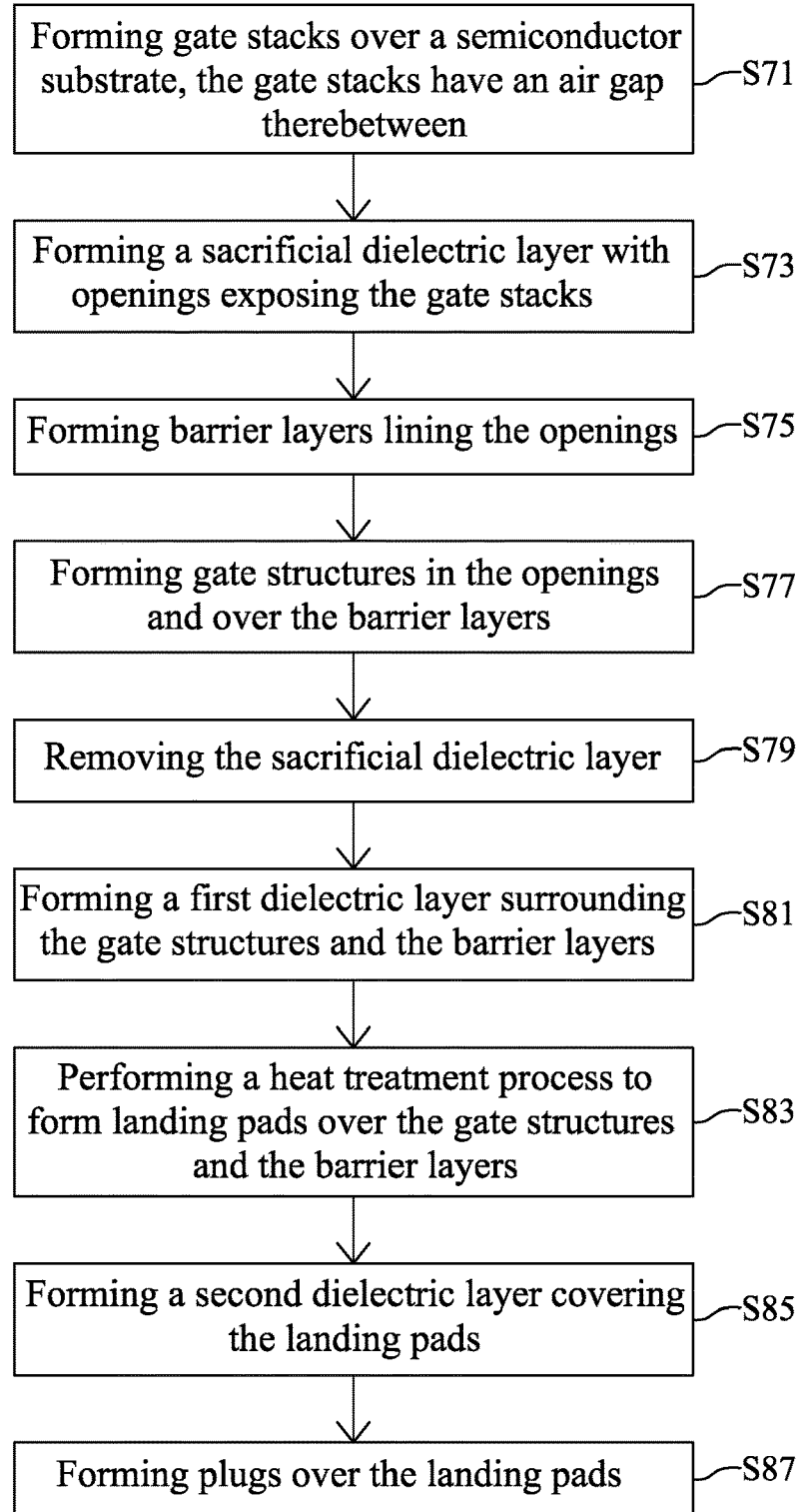
FIG. 23 is a cross-sectional view illustrating an intermediate stage of depositing a second dielectric layer such that an air gap is formed between the lower plugs during the formation of the semiconductor device, in accordance with some embodiments.

FIG. 23 is a flow diagram illustrating a method 70 for forming a semiconductor device (e.g., the semiconductor device 400 of FIG. 4), and the method 70 includes steps S71, S73, S75, S77, S79, S81, S83, S85 and S87, in accordance with some embodiments. The steps S71 to S87 of FIG. 23 are elaborated in connection with the following figures.

Figure 24:
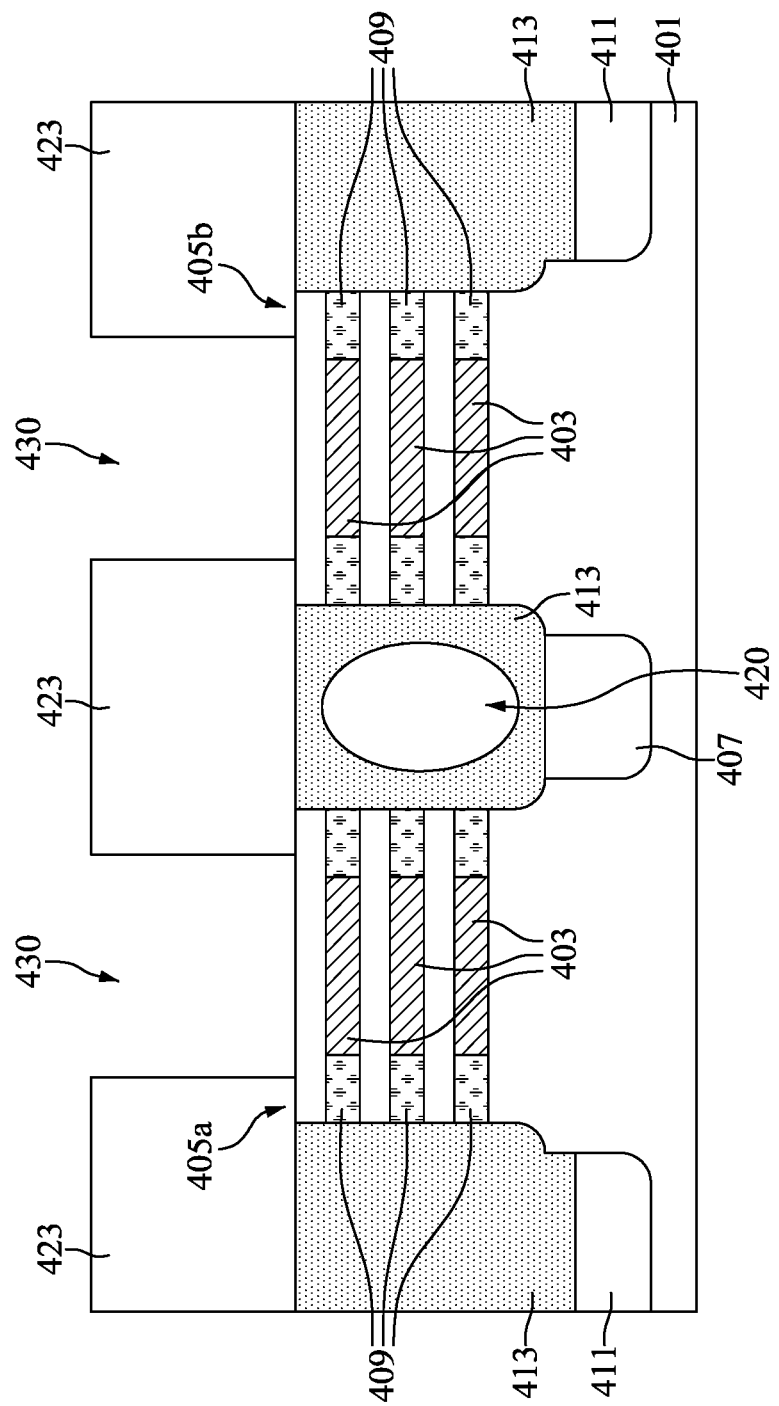
FIG. 24 is a cross-sectional view illustrating an intermediate stage of forming a sacrificial dielectric layer with openings exposing gate stacks during the formation of the semiconductor device, in accordance with some embodiments.

FIGS. 24-28 are cross-sectional views illustrating intermediate stages during the formation of the semiconductor device 400, in accordance with some embodiments. As shown in FIG. 24, the semiconductor substrate 401, the gate stacks 405a, 405b, the gate layers 403, the inner spacers 409, the inner isolation structure 407, the outer isolation structures 411, and the semiconductor material 413 may be similar to the semiconductor substrate 201, the gate stacks 205a, 205b, the gate layers 203, the inner spacers 209, the inner isolation structure 207, the outer isolation structures 211, and the semiconductor material 213 of the semiconductor device 200, respectively, and the description is not repeated herein.

Moreover, in some embodiments, the air gap 420 is formed over the inner isolation structure 407 due to the high aspect ratio of the opening between the gate stacks 405a and 405b. In some embodiments, the air gap 420 is enclosed by the semiconductor material 413. It should be noted that since the gate stacks 405a and 405b have the air gap 420 between them, the parasitic capacitance between the gate stacks 405a and 405b may be reduced.

A sacrificial dielectric layer 423 with openings 430 is formed over the semiconductor material 413 and the gate stacks 405a, 405b, as shown in FIG. 24 in accordance with some embodiments. In some embodiments, at least one of the gate stacks 405a and 405b is partially exposed by the corresponding openings 430. The respective steps are illustrated as the steps S71 and S73 in the method 70 shown in FIG. 23.

The sacrificial dielectric layer 423 may be made of silicon oxide, silicon nitride, silicon oxynitride, silicon carbide, silicon oxycarbide, silicon carbonitride, silicon oxycarbonitride, or the like. In some embodiments, the sacrificial dielectric layer 423 is formed by depositing a dielectric material (not shown) over the semiconductor material 413 and the gate stacks 405a, 405b, and etching the dielectric material to form the openings 430. In some other embodiments, the sacrificial dielectric layer 423 is formed by forming sacrificial patterns (not shown) over the semiconductor material 413 and the gate stacks 405a, 405b, forming a sacrificial dielectric material (not shown) surrounding the sacrificial patterns, planarizing the sacrificial dielectric material such that the top surface of the remaining sacrificial dielectric material (i.e., the sacrificial dielectric layer 323) is substantially level with the top surfaces of the sacrificial patterns, and removing the sacrificial patterns.

Next, the barrier layers 431 are formed lining the bottom surface and the sidewalls of the openings 430, and the gate structures 433 are formed over and surrounded by the barrier layers 431. The respective steps are illustrated as the steps S75 and S77 in the method 70 shown in FIG. 23. In some embodiments, the barrier layers 431 are made of a titanium-containing material, such as titanium (Ti) or titanium nitride (TiN), and the gate structures 433 are made of copper (Cu). The barrier layers 431 and the gate structures 433 may be formed by deposition processes, such as CVD, ALD, PVD, sputtering, or plating. After the deposition processes, a planarization process (e.g., a CMP process) may be performed such that the top surfaces of the barrier layers 331 and the top surfaces of the gate structures 433 are substantially level with the top surface of the sacrificial dielectric layer 423.

In some embodiments, at least one of the gate structures 433 and the corresponding barrier layers 431 collectively have a width W9. Since the thicknesses of the barrier layers 431 are too small compared to the thicknesses of the gate structures 433, the width of at least one of the gate structures 433 may be substantially the same as the width W9. In addition, in some embodiments, the top portions of the adjacent barrier layers 431 have a distance D7 between them. Since the thicknesses of the barrier layers 431 are too small compared to the thicknesses of the gate structures 433, the distance between the adjacent gate structures 433 is substantially the same as the distance D7.

Figure 26:
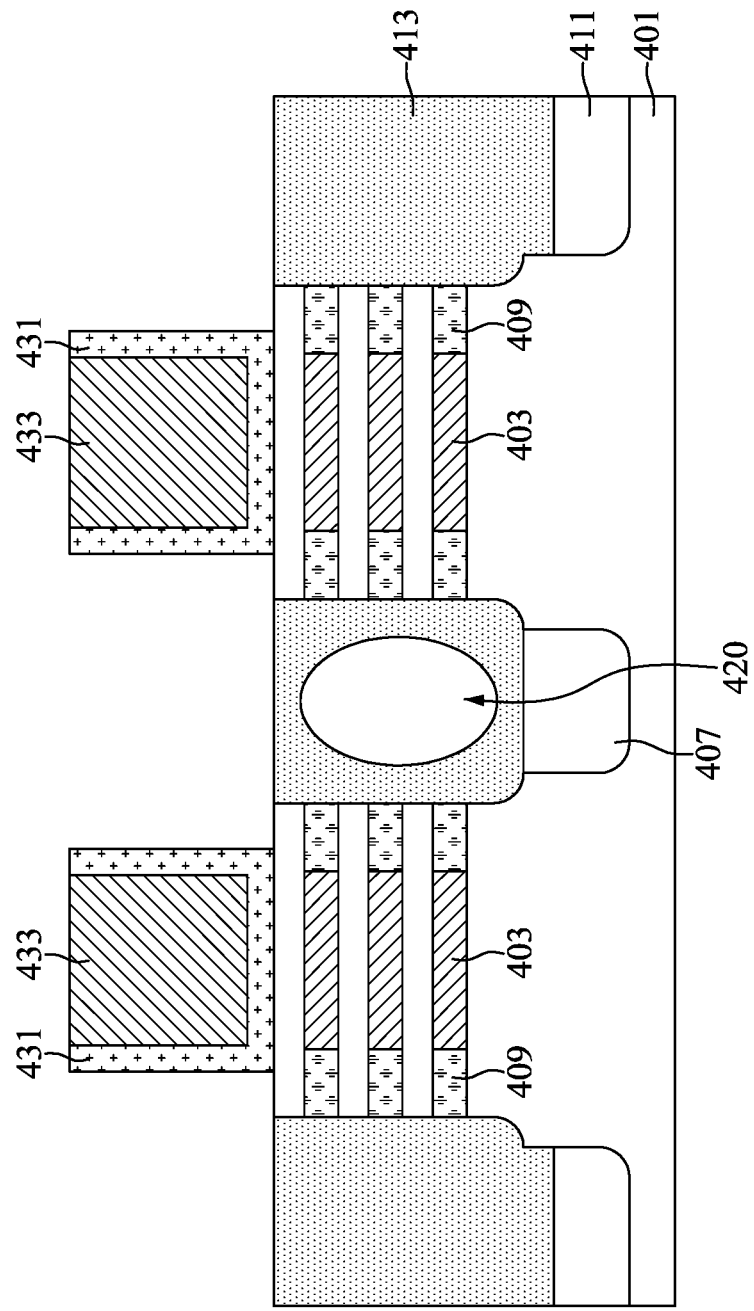
FIG. 26 is a cross-sectional view illustrating an intermediate stage of removing the sacrificial dielectric layer during the formation of the semiconductor device, in accordance with some embodiments.

After the barrier layers 431 and the gate structures 433 are formed, the sacrificial dielectric layer 423 is removed, as shown in FIG. 26 in accordance with some embodiments. The respective step is illustrated as the step S79 in the method 70 shown in FIG. 23. In some embodiments, the sacrificial dielectric layer 423 is removed by a stripping process (e.g., a wet strip process) and/or an ashing process (e.g., a plasma ashing process).

Figure 27:
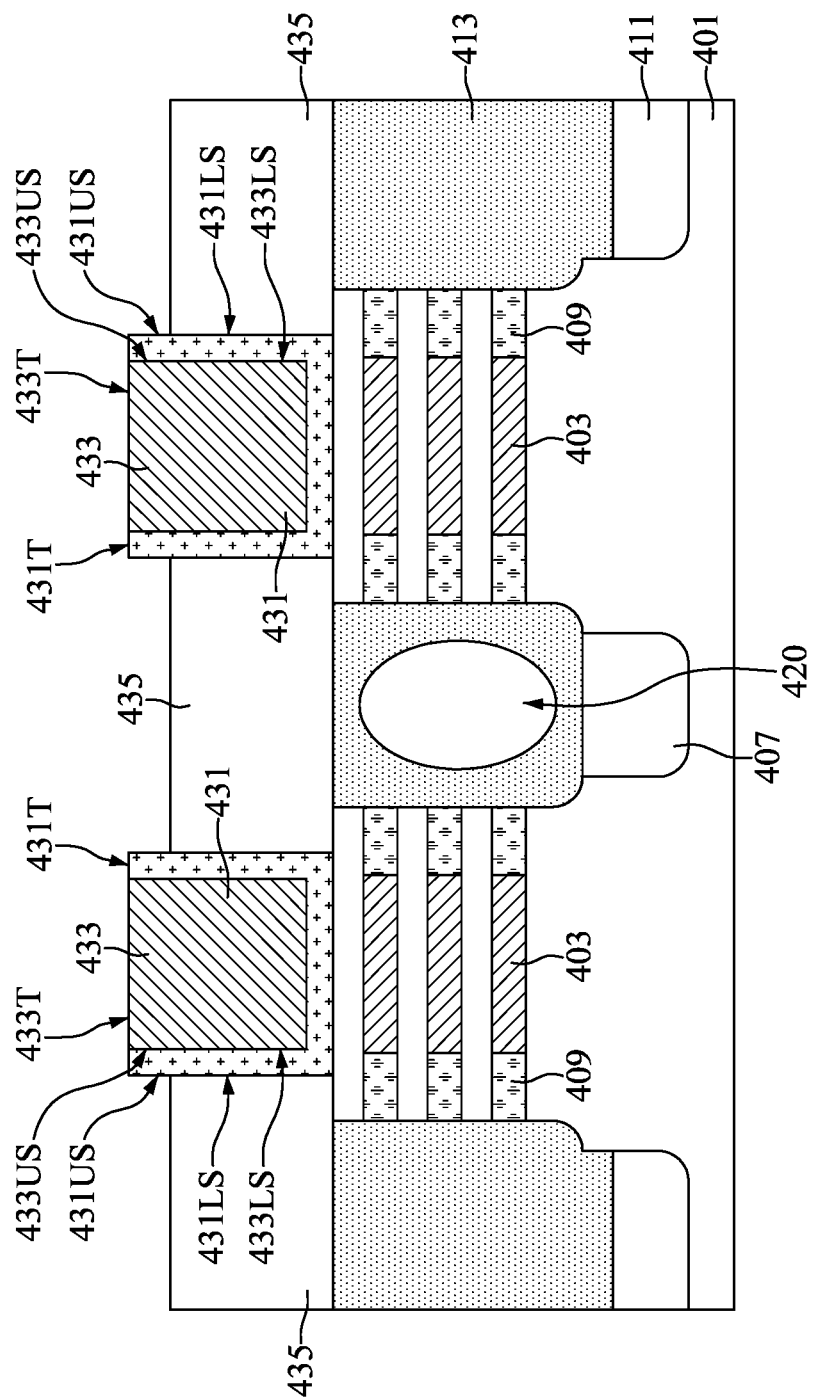
FIG. 27 is a cross-sectional view illustrating an intermediate stage of forming a first dielectric layer surrounding the gate structures and the barrier layers during the formation of the semiconductor device, in accordance with some embodiments.

Subsequently, the dielectric layer 435 is formed surrounding the lower portions of the gate structures 433 and the barrier layers 431 and exposing the upper portions of the gate structures 433 and the barrier layers 431, as shown in FIG. 27 in accordance with some embodiments. The respective step is illustrated as the step S81 in the method 70 shown in FIG. 23. Some materials and processes used to form the dielectric layer 435 are similar to, or the same as those used to form the sacrificial dielectric layer 423, and details thereof are not repeated herein. The dielectric layer 435 is formed by depositing a dielectric material (not shown) over the semiconductor material 413 and the gate stacks 405a, 405b, the gate structures 433 and the barrier layers 431 by a deposition process, such as a CVD process, an ALD process, or a PVD process, and removing the upper portion of the dielectric layer 435 by a CMP process or an etch-back process.

After the upper portion of the dielectric layer 435 is removed, the upper portions of the gate structures 433 and the upper portions of the barrier layers 431 are protruded from the dielectric layer 435. In some embodiments, the top surfaces 433T and the upper sidewalls 433US of the gate structures 433, and the top surfaces 431T and the upper sidewalls 431US of the barrier layers 431 are protruded (and/or exposed), while the lower sidewalls 433LS of the gate structures 433 and the lower sidewalls 431LS of the barrier layers 431 are covered by the dielectric layer 435, in accordance with some embodiments.

In some embodiments, the formation of the dielectric layer 435 is omitted. In these cases, the sacrificial dielectric layer 423 are partially removed such that the lower portion of the sacrificial dielectric layer 423 remains covering the lower sidewalls 431 LS of the barrier layers 431 and the lower sidewalls 433LS of the gate structures 433.

Figure 28:
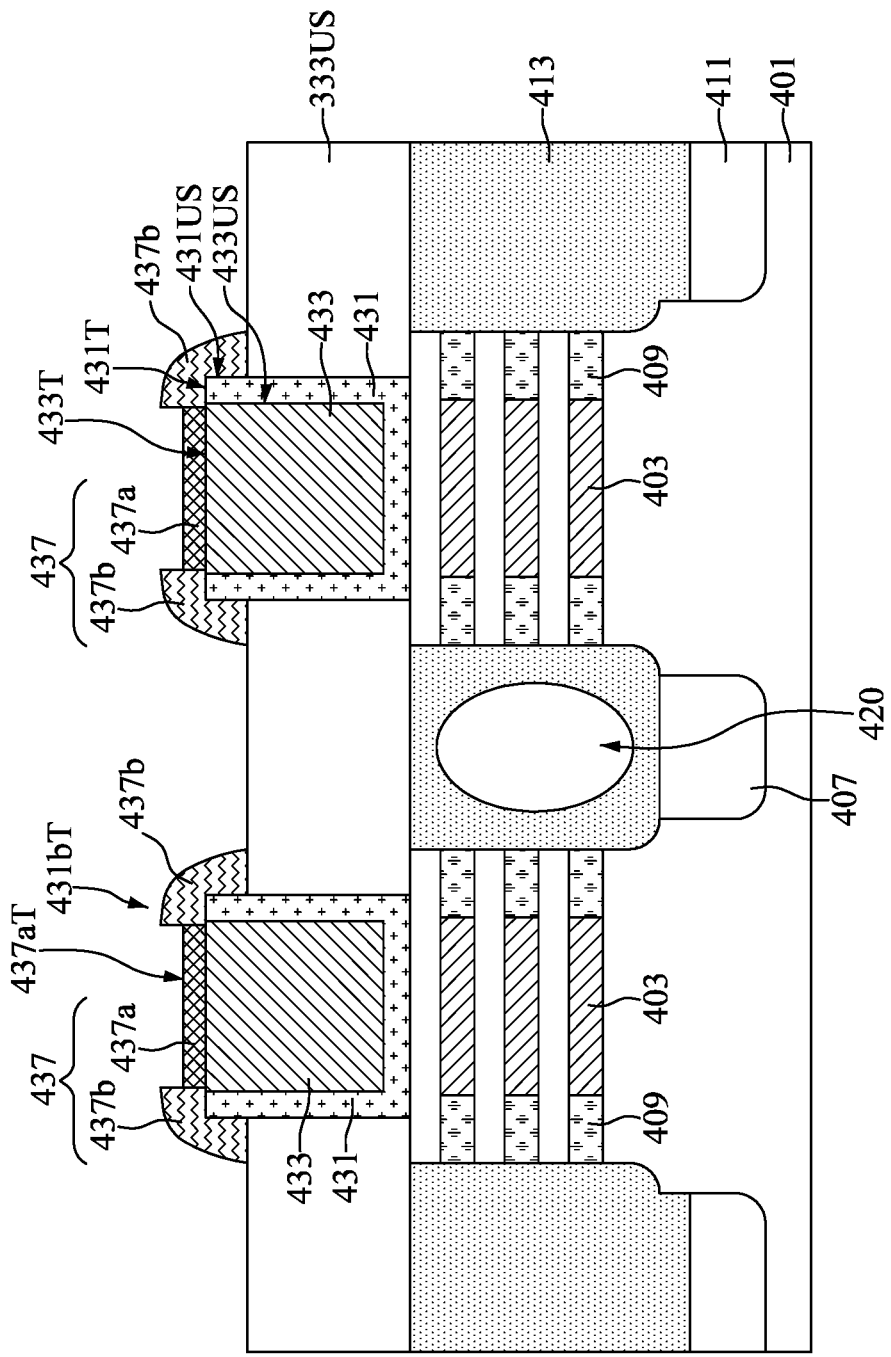
FIG. 28 is a cross-sectional view illustrating an intermediate stage of forming landing pads over the gate structures and the barrier layers during the formation of the semiconductor device, in accordance with some embodiments.

Then, a heat treatment process is performed to form the landing pads 437 over the top surfaces 433T and the upper sidewalls 433US of the gate structures 433 and over the top surfaces 431T and the upper sidewalls 431US of the barrier layers 431, as shown in FIG. 28 in accordance with some embodiments. The respective step is illustrated as the step S83 in the method 70 shown in FIG. 23. In some embodiments, at least one of the landing pads 437 includes the outer portions 437b and the inner portion 437a disposed between the outer portions 437b.

In some embodiments, a silicon-containing gas is used during the heat treatment process to selectively form the inner portions 437a of the landing pads 437 on the exposed top surfaces 433T of the gate structures 433, and selectively form the outer portions 437b of the landing pads 437 on the exposed top surfaces 431T and the upper sidewalls 431US of the barrier layers 431. In some embodiments, the inner portions 437a and the outer portions 437b are made of different materials, but they are simultaneously formed by the heat treatment process. In some embodiments, the inner portions 437a are made of tungsten silicide (WSi), and the outer portions 437b are made of titanium silicide (TiSi). Since the landing pads 437 provide increased landing areas for the subsequently formed plugs to land on, the misalignment issues between the subsequently formed plugs and the gate structures 433 may be prevented or reduced.

Referring back to FIG. 4, the dielectric layer 443 is formed over the dielectric layer 435 and covering the landing pads 437, and the plugs 453 are formed in the dielectric layer 443 and over the landing pads 437, in accordance with some embodiments. The respective steps are illustrated as the steps S85 and S87 in the method 70 shown in FIG. 23. Some materials and processes used to form the dielectric layer 443 are similar to, or the same as those used to form the dielectric layer 435, and details thereof are not repeated herein. In some embodiments, the plugs 453 are made of a conductive material, such as copper (Cu), tungsten (W), aluminum (Al), titanium (Ti), tantalum (Ta), gold (Au), silver (Ag), or a combination thereof.

Figure 25:
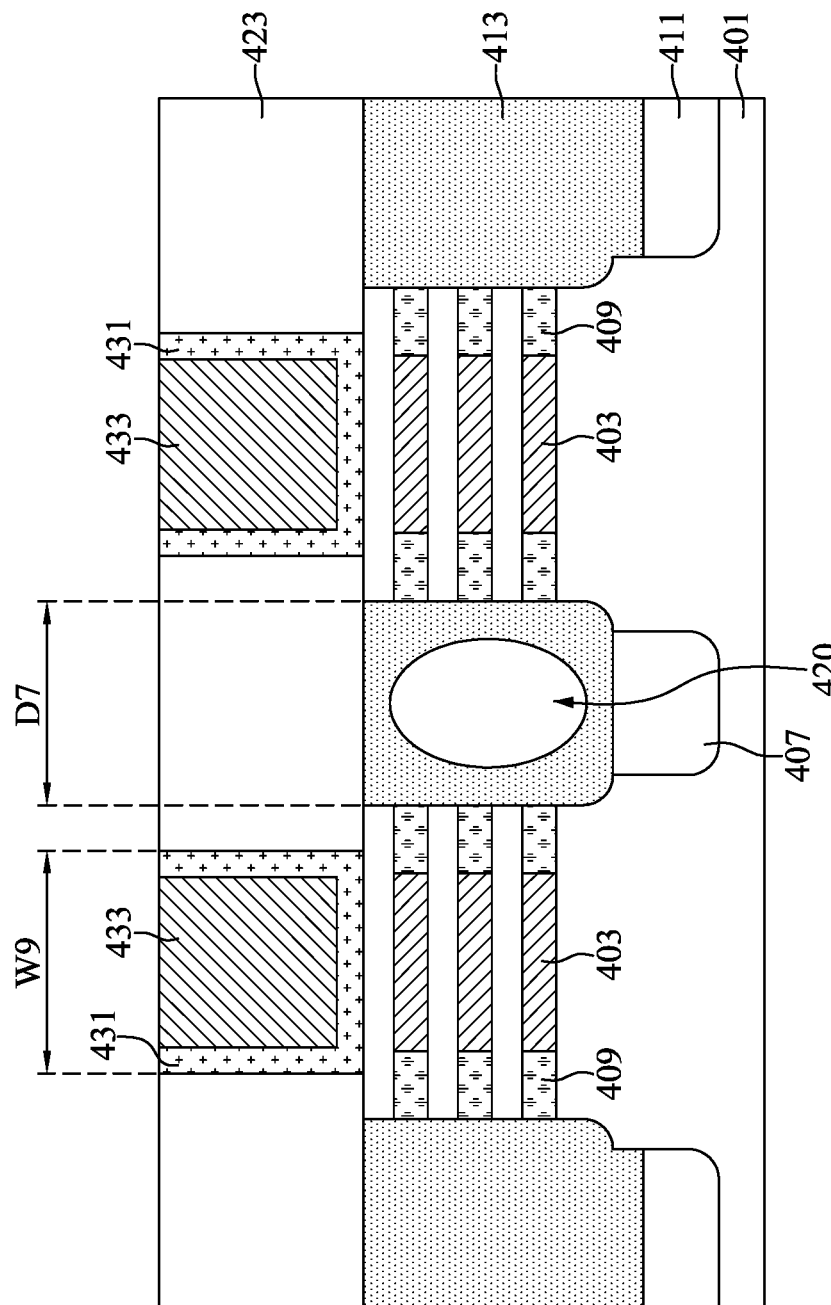
FIG. 25 is a cross-sectional view illustrating an intermediate stage of forming barrier layers and lower plugs in the openings during the formation of the semiconductor device, in accordance with some embodiments.

In addition, the plugs 453 may be formed by etching the dielectric layer 443 to form a plurality of openings (not shown) exposing the corresponding landing pads 437, depositing a conductive material (not shown) in the openings and over the dielectric layer 443, and planarizing the conductive material such that the top surfaces of the remaining conductive material (i.e., the plugs 453) are substantially level with the top surface of the dielectric layer 443. After the plugs 453 are formed, the semiconductor device 400 is obtained. Referring to FIGS. 4 and 25, the width W9 is greater than the width W10, and the distance D8 is greater than the distance D7.

Embodiments of the semiconductor devices 100, 200, 300 and 400 and method for forming the same are provided in the disclosure. In some embodiments, at least one of the semiconductor devices 100, 200, 300 and 400 includes a plurality of conductive features (e.g., the lower plugs 133 of the semiconductor device 100, the gate structures 233 of the semiconductor device 200, the lower plugs 333 of the semiconductor device 300, and the gate structures 433 of the semiconductor device 400), a plurality of landing pads (e.g., the landing pads 137 of the semiconductor device 100, the landing pads 237 of the semiconductor device 200, the landing pads 337 of the semiconductor device 300, and the landing pads 437 of the semiconductor device 400) disposed over the top surfaces and the upper sidewalls of the conductive features, and a plurality of upper plugs (e.g., the upper plugs 153 of the semiconductor device 100, the plugs 253 of the semiconductor device 200, the upper plugs 353 of the semiconductor device 300, and the plugs 453 of the semiconductor device 400) disposed over the landing pads. The landing pads provide increased landing areas for the upper plugs to land on. Therefore, the misalignment issues between the upper plugs and the conductive features thereunder may be prevented or reduced, and the contact resistances may be reduced.

Moreover, air gaps are formed below the landing pads and between the conductive features (or between the gate stacks under the conductive features). For example, the air gap 150 of the semiconductor device 100 is formed between the lower plugs 133, the air gap 220 of the semiconductor device 200 is formed between the gate stacks 205a and 205b, the air gap 350 of the semiconductor device 300 is formed between the lower plugs 333, and the air gap 420 of the semiconductor device 400 is formed between the gate stacks 405a and 405b. Therefore, the parasitic capacitances between the conductive features or the gate stacks may be reduced. As a result, the yield rate of the semiconductor devices 100, 200, 300 and 400 may be increased, and the overall device performance may be improved.

In one embodiment of the present disclosure, a semiconductor device is provided. The semiconductor device includes a first lower plug and a second lower plug disposed over a semiconductor substrate. The semiconductor device also includes a first landing pad disposed over a top surface and upper sidewalls of the first lower plug, and a first upper plug disposed over the first landing pad and electrically connected to the first lower plug. A width of the first lower plug is greater than a width of the first upper plug. The semiconductor device further includes a dielectric layer disposed over the semiconductor substrate. The first lower plug, the second lower plug, the first landing pad and the first upper plug are disposed in the dielectric layer, and the dielectric layer includes an air gap disposed between the first lower plug and the second lower plug.

In another embodiment of the present disclosure, a method for forming a semiconductor device is provided. The method includes forming a first lower plug and a second lower plug over a semiconductor substrate, and forming a first dielectric layer surrounding the first lower plug and the second lower plug. A top surface and upper sidewalls of the first lower plug and a top surface and upper sidewalls of the second lower plug are protruded from the first dielectric layer. The method also includes performing a heat treatment process to form a first landing pad over the top surface and the upper sidewalls of the first lower plug and a second landing pad over the top surface and the upper sidewalls of the second lower plug, and removing the first dielectric layer after the heat treatment process is performed such that an opening is formed between the first lower plug and the second lower plug. The method further includes depositing a second dielectric layer in the opening and over the first landing pad and the second landing pad such that an air gap is formed in the opening and enclosed by the second dielectric layer, and forming a first upper plug in the second dielectric layer and over the first landing pad. A width of the first lower plug is greater than a width of the first upper plug.

The embodiments of the present disclosure have some advantageous features. By forming a landing pad between a lower plug and an upper plug (or a gate structure and a plug over the gate structure), the misalignment issues may be prevented or reduced, which reduces the contact resistance. Moreover, by forming an air gap below the landing pad and between the adjacent lower plugs (or the adjacent gate stacks), the parasitic capacitance may be reduced. As a result, the yield rate of the semiconductor device may be increased, and the device performance may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a first lower plug and a second lower plug disposed over a semiconductor substrate;
   a first landing pad disposed over a top surface and upper sidewalls of the first lower plug;
   a first upper plug disposed over the first landing pad and electrically connected to the first lower plug, wherein a width of the first lower plug is greater than a width of the first upper plug; and
   a dielectric layer disposed over the semiconductor substrate, wherein the first lower plug, the second lower plug, the first landing pad and the first upper plug are disposed in the dielectric layer, and wherein the dielectric layer comprises an air gap disposed between the first lower plug and the second lower plug;
   wherein a bottom width of the first lower plug is greater than a top width of the first lower plug, and the top width of the first lower plug is greater than the width of the first upper plug.

2. The semiconductor device of claim 1, further comprising:
   a second landing pad disposed over a top surface and upper sidewalls of the second lower plug; and
   a second upper plug disposed over the second landing pad and electrically connected to the second lower plug, wherein a distance between the first upper plug and the second upper plug is greater than a distance between the first lower plug and the second lower plug.

3. The semiconductor device of claim 1, wherein a top surface of the first lower plug is higher than a topmost surface of the air gap.

4. The semiconductor device of claim 1, wherein the first landing pad is made of copper germanide ($Cu_3Ge$).

5. The semiconductor device of claim 1, further comprising:
   a first barrier layer covering a bottom surface, lower sidewalls and the upper sidewalls of the first lower plug, wherein a portion of the first barrier layer is sandwiched between the first landing pad and the first lower plug.

6. The semiconductor device of claim 5, wherein the first landing pad comprises:
   an inner portion covering the top surface of the first lower plug; and a plurality of outer portions covering top surfaces and upper sidewalls of the first barrier layer, wherein the inner portion and the outer portions are made of different materials.

7. The semiconductor device of claim 6, wherein top surfaces of the outer portions of the first landing pad are higher than a top surface of the inner portion of the first landing pad.

8. The semiconductor device of claim 6, wherein the inner portion of the first landing pad is made of tungsten silicide (WSi), and the outer portions of the first landing pad are made of titanium silicide (TiSi).

* * * * *